US012278168B1

(12) United States Patent
Oh et al.

(10) Patent No.: US 12,278,168 B1
(45) Date of Patent: *Apr. 15, 2025

(54) SEMICONDUCTOR DEVICE INCLUDING INTERCONNECT STRUCTURE WITH PLANARIZATION STOP LAYER

(71) Applicant: SAMSUNG ELECTRONICS CO., LTD., Suwon-si (KR)

(72) Inventors: Joongsuk Oh, Watervliet, NY (US); Jaemyung Choi, Niskayuna, NY (US); Kang-Ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/886,289

(22) Filed: Sep. 16, 2024

Related U.S. Application Data

(60) Provisional application No. 63/569,548, filed on Mar. 25, 2024.

(51) Int. Cl.
| | | |
|---|---|---|
| *H01L 23/522* | (2006.01) | |
| *H01L 21/768* | (2006.01) | |
| *H01L 23/00* | (2006.01) | |
| *H01L 23/48* | (2006.01) | |
| *H01L 29/417* | (2006.01) | |

(52) U.S. Cl.
CPC ...... *H01L 23/481* (2013.01); *H01L 21/76819* (2013.01); *H01L 21/76885* (2013.01); *H01L 21/76892* (2013.01); *H01L 23/562* (2013.01); *H01L 29/41725* (2013.01)

(58) Field of Classification Search
CPC ........... H01L 21/76885; H01L 23/5226; H01L 23/5283; H01L 21/76834; H01L 21/7685
See application file for complete search history.

(56) References Cited

U.S. PATENT DOCUMENTS

| | | | |
|---|---|---|---|
| 7,910,912 B2 * | 3/2011 | Park ................. | B82Y 10/00 |
| | | | 257/E23.141 |
| 2015/0270221 A1 * | 9/2015 | An .................... | H01L 21/76885 |
| | | | 257/774 |
| 2023/0022545 A1 * | 1/2023 | Lee .................. | H01L 21/76832 |
| 2023/0402375 A1 * | 12/2023 | Kim .................. | H01L 21/76885 |

FOREIGN PATENT DOCUMENTS

KR 10-2010-0072556 A1 7/2010

* cited by examiner

*Primary Examiner* — Jaehwan Oh
(74) *Attorney, Agent, or Firm* — Sughrue Mion, PLLC

(57) ABSTRACT

Provided is a semiconductor device including a base layer and an interconnect structure on the base layer, the interconnect structure including: a $1^{st}$ metal line on the base layer; a $1^{st}$ top via vertically protruded from the $1^{st}$ metal line without a connection surface therebetween; an isolation layer on the $1^{st}$ metal line and the $1^{st}$ top via; and a planarization stop layer vertically and laterally on the isolation layer.

20 Claims, 22 Drawing Sheets

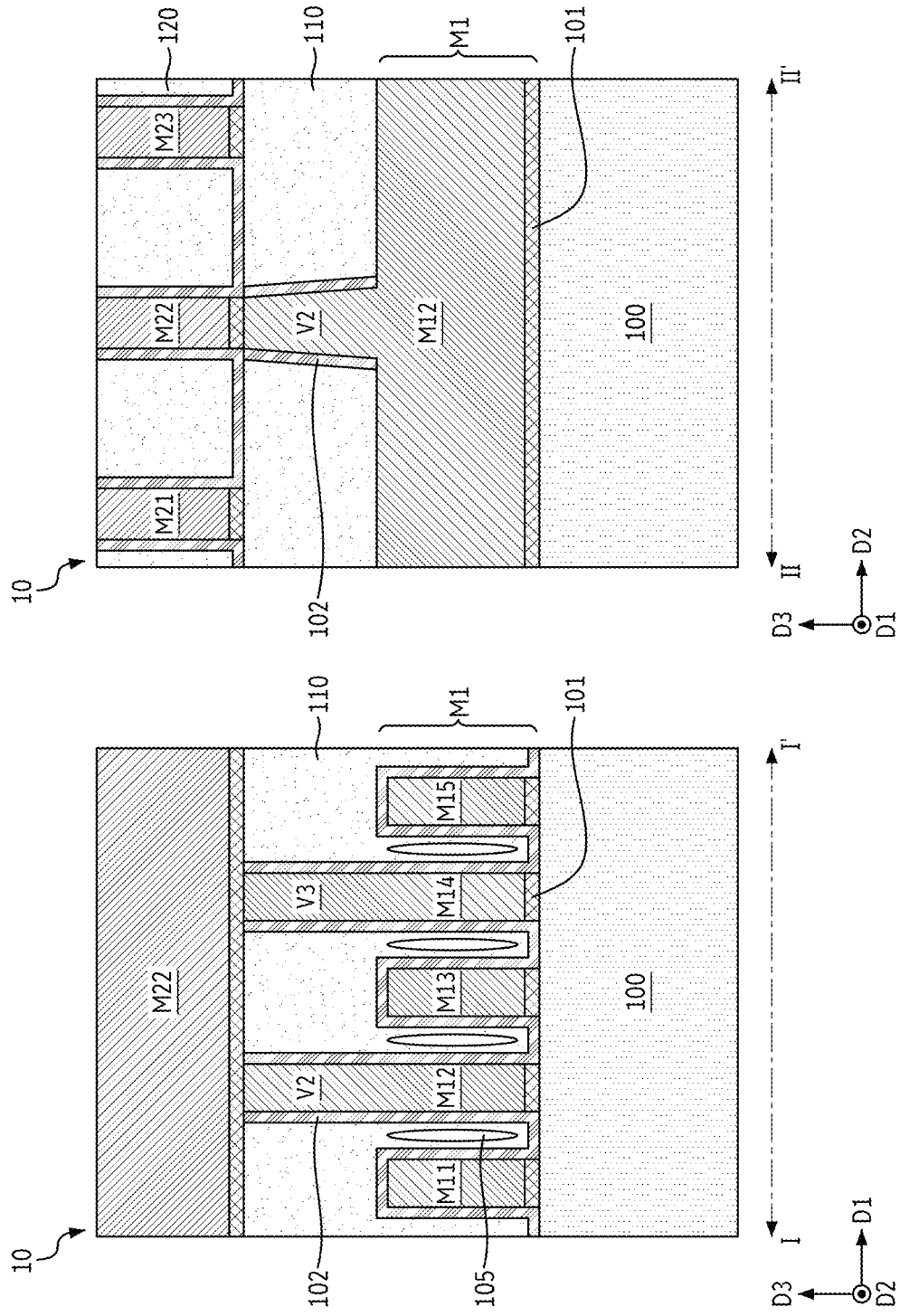

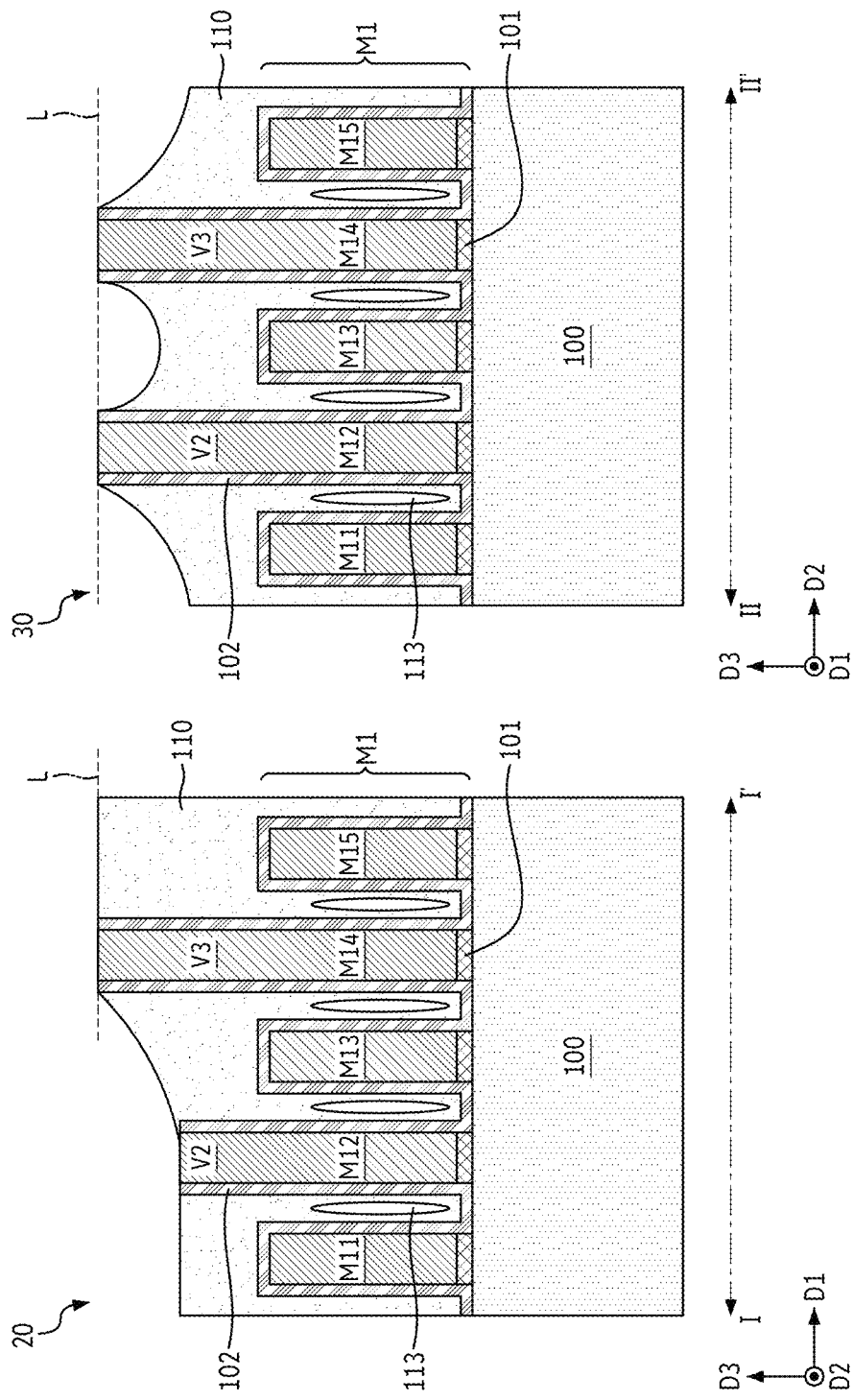

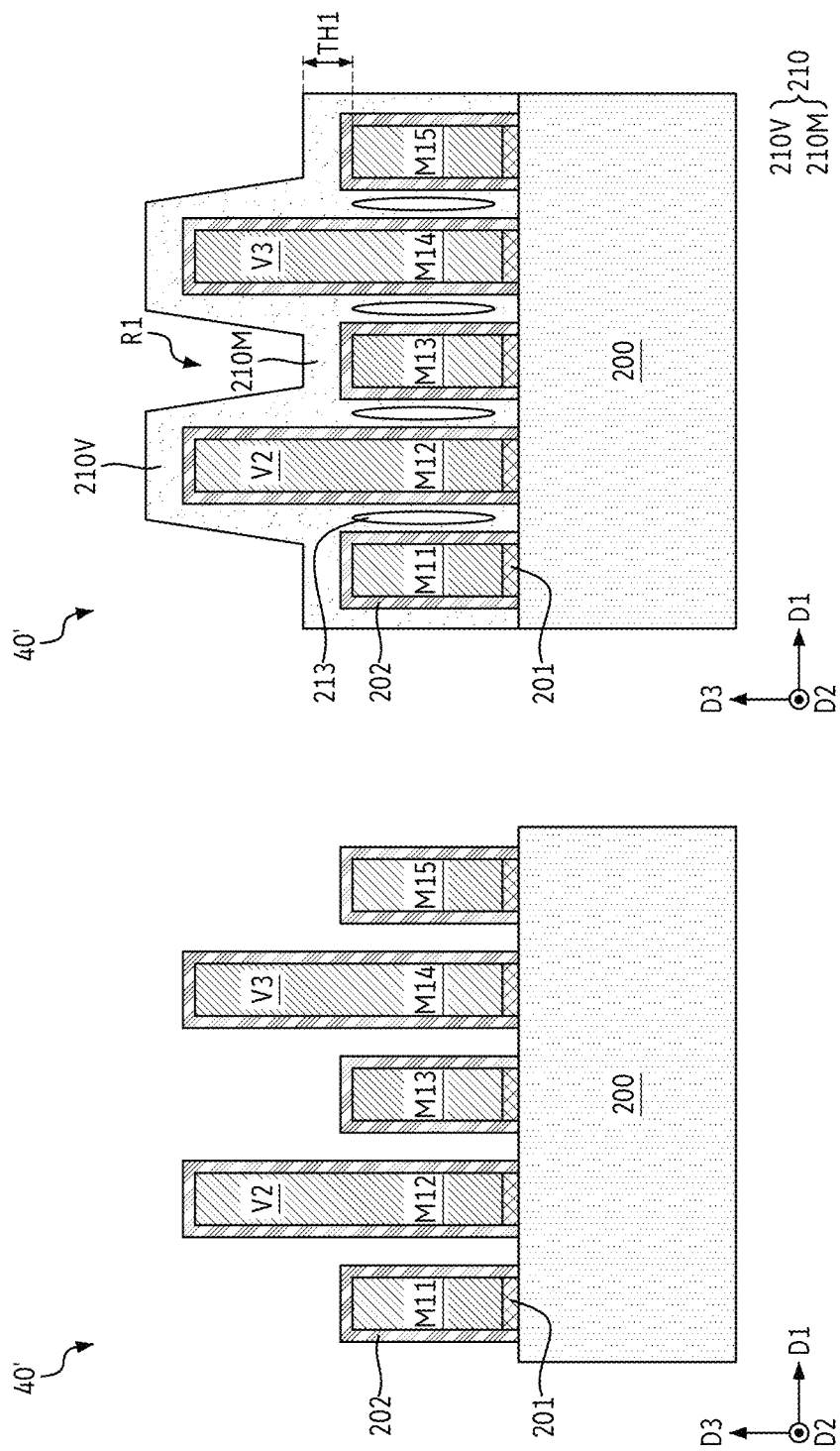

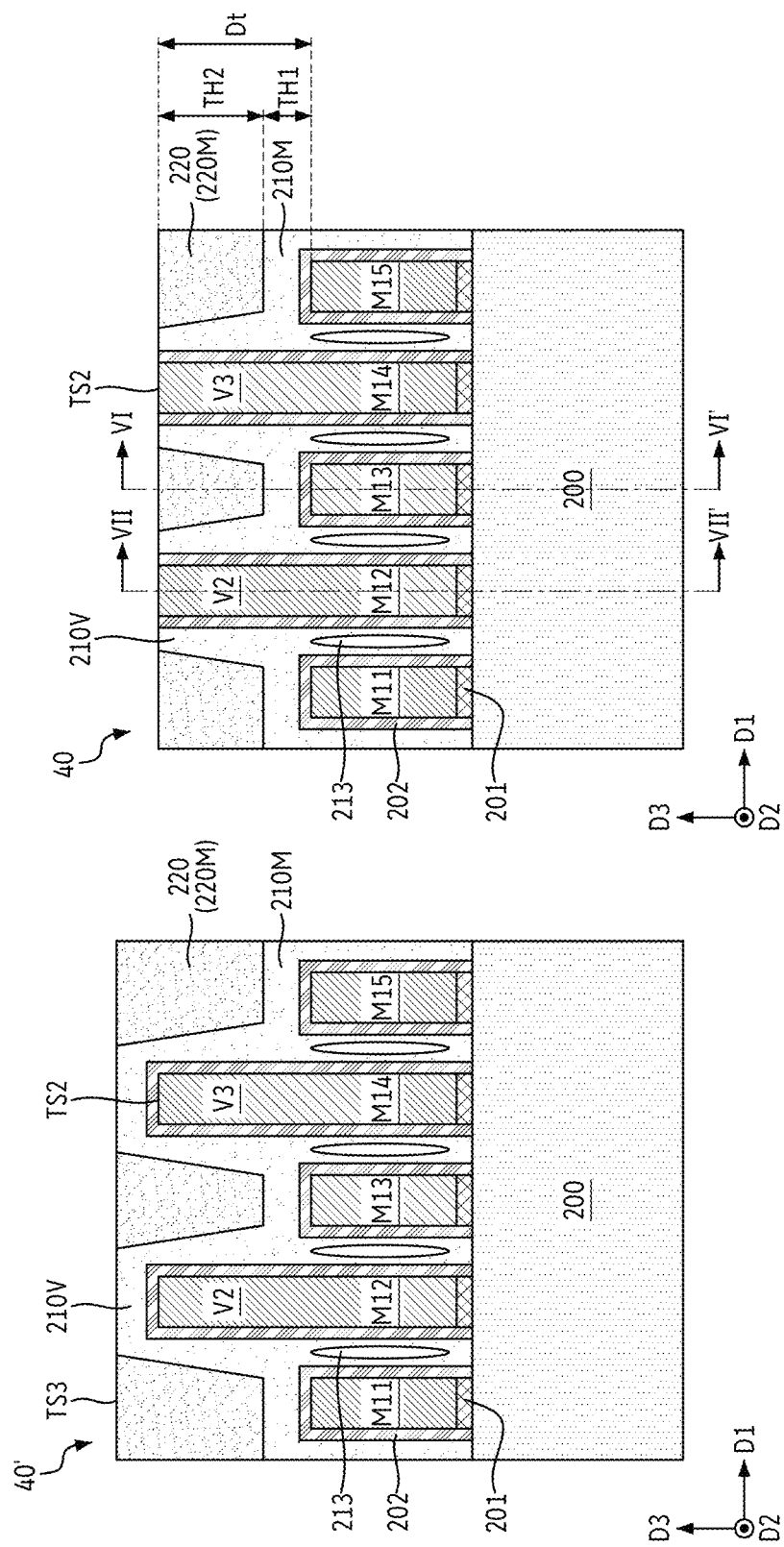

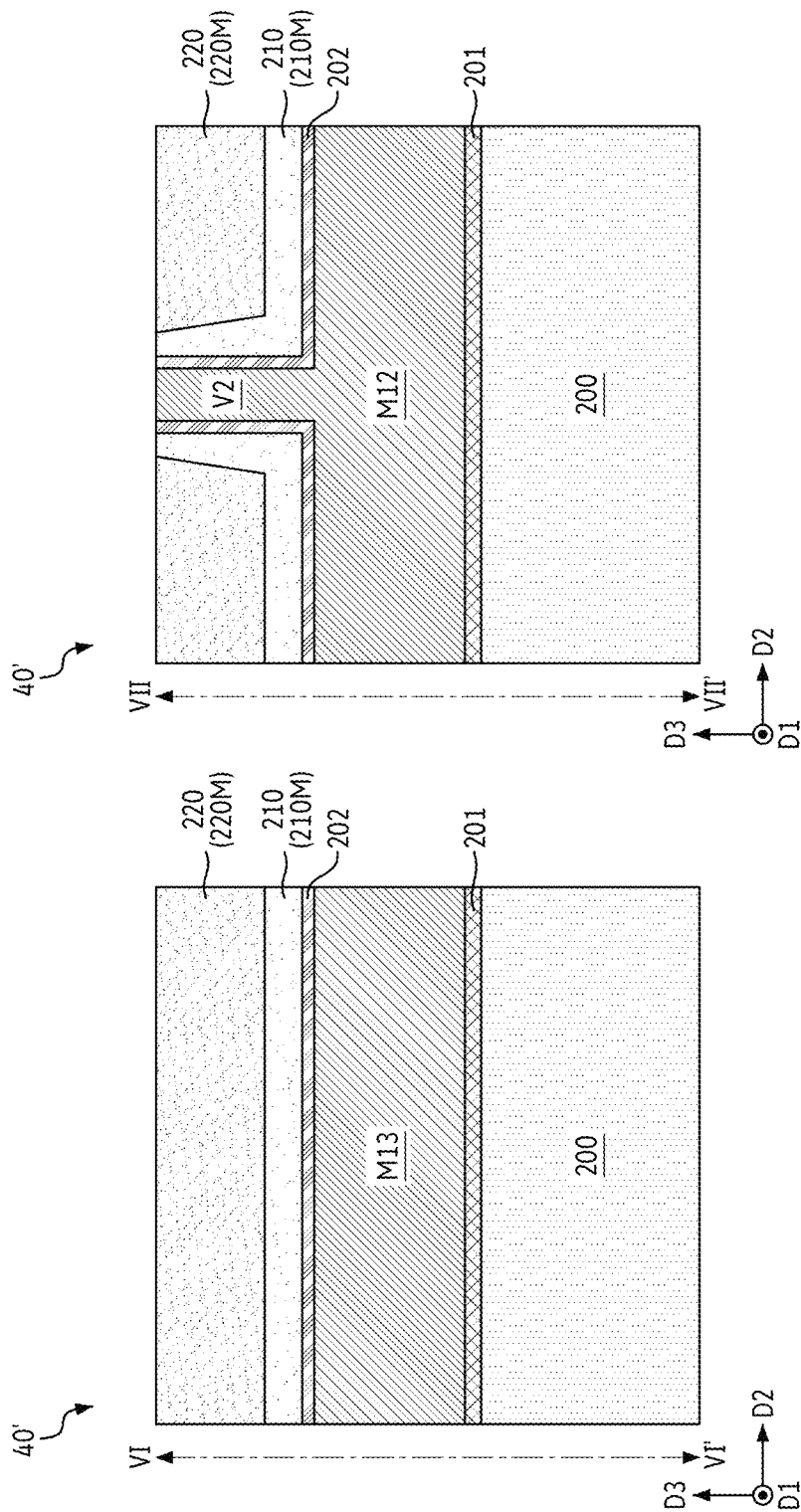

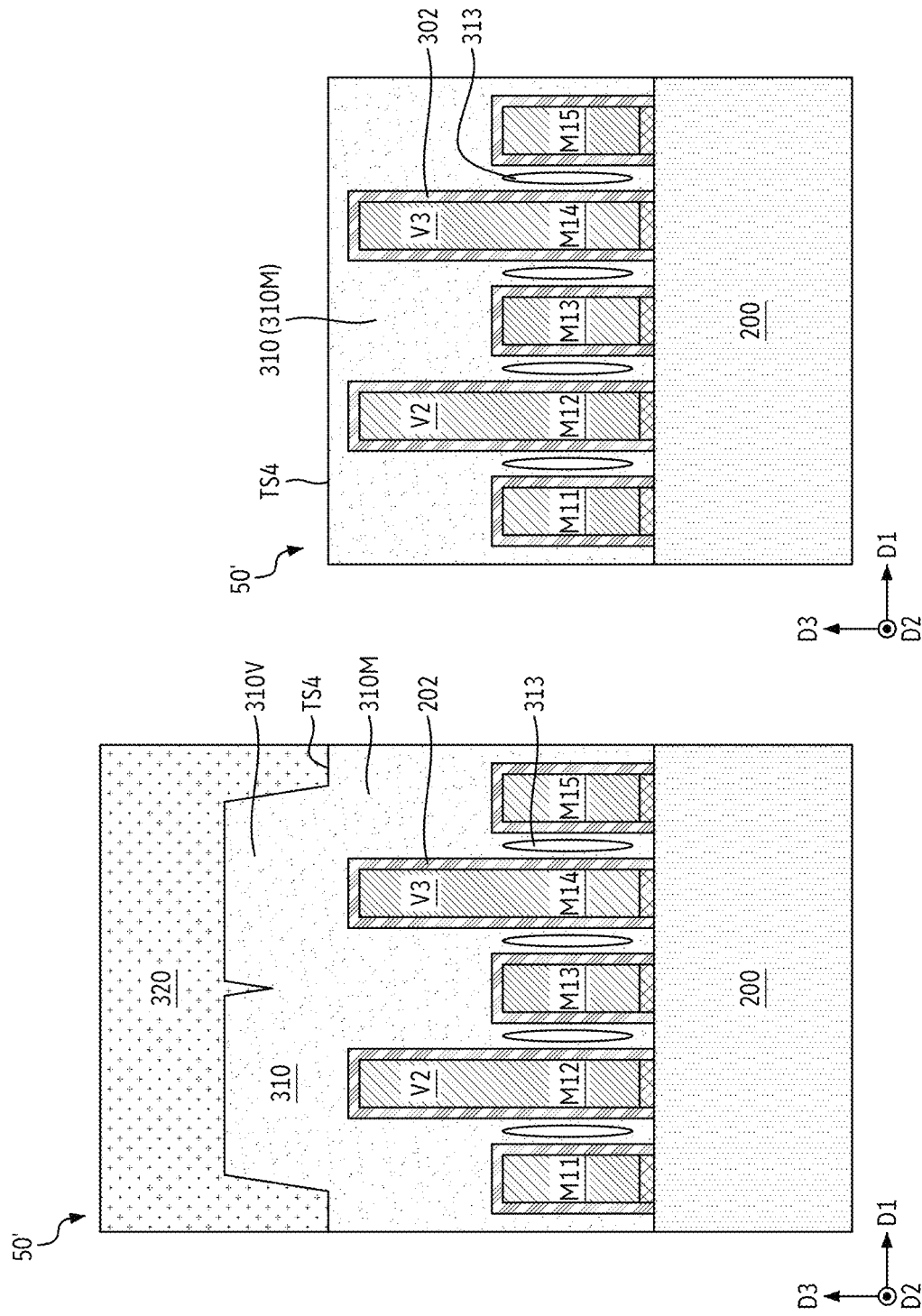

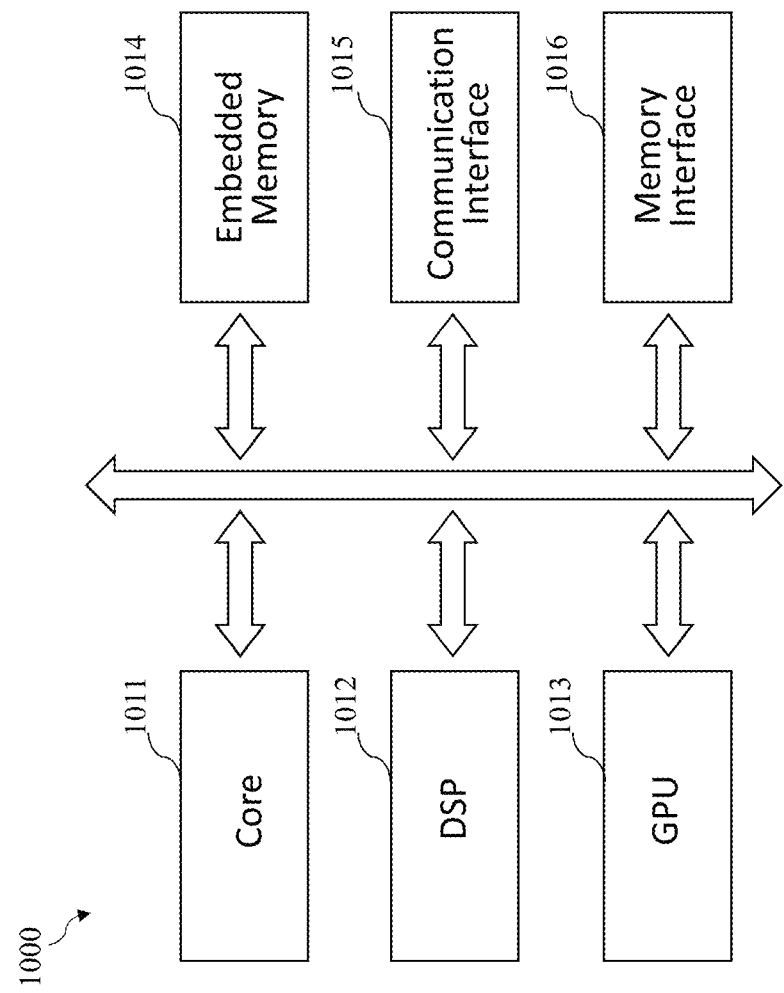

SEMICONDUCTOR DEVICE INCLUDING INTERCONNECT STRUCTURE WITH PLANARIZATION STOP LAYER

CROSS-REFERENCE TO RELATED APPLICATIONS

This application is based on and claims priority from U.S. Provisional Application No. 63/569,548 filed on Mar. 25, 2024 in the U.S. Patent and Trademark Office, the disclosure of which is incorporated herein in its entirety by reference.

BACKGROUND

1. Field

Apparatuses and methods consistent with example embodiments of the disclosure relate to a semiconductor device including an interconnect structure in which a planarization stop layer in formed on metal lines.

2. Description of the Related Art

Performance of a semiconductor device is affected by how an interconnect structure is formed in the semiconductor device. The interconnect structure includes back-end-of-line (BEOL) structures such as metal lines and vias which connect front-end-of-line (FEOL) structures to a voltage source or other circuit elements through middle-of-line (MOL) structures. The interconnect structure also includes a dielectric layer surrounding the metal lines and the vias to electrically isolate these metal structures from each other or other circuit elements. The FEOL structures include transistor structures such as a channel structure, source/drain regions, and a gate structure, and the MOL structures include contact plugs formed on the source/drain regions and the gate structures.

As semiconductor devices are developed to have a high device density and performance, design and formation of the interconnect structure of the semiconductor device become more difficult and complicated while improved resistance and capacitance (RC) characteristics are required for the semiconductor device.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides a method of forming an interconnect structure through two planarization operations to avoid possible via loss in an inter-metal dielectric (EVID) layer surrounding a metal line and a via formed thereon, and dishing on the IMD layer, thereby improving connection performance of the interconnect structure and prevent a short-circuit risk.

According to an aspect of one or more embodiments, there is provided a semiconductor device including a base layer and an interconnect structure on the base layer, the interconnect structure including: a $1^{st}$ metal line on the base layer; a $1^{st}$ top via vertically protruded from the $1^{st}$ metal line without a connection surface therebetween; an isolation layer on the $1^{st}$ metal line and the $1^{st}$ top via; and a planarization stop layer vertically and laterally on the isolation layer.

According to an aspect of one or more embodiments, there is provided a semiconductor device including a base layer and an interconnect structure on the base layer, the interconnect structure including: a metal line on the base layer; a top via vertically protruded from the metal line without a connection surface therebetween; an isolation layer vertically on the metal line and laterally on the top via; and an open area on the base layer where no metal line is formed at a level where the metal line is provided, wherein the open area comprises at least two dielectric layers comprising the isolation layer which is vertically on the base layer.

According to an aspect of one or more embodiments, there is provided a method of manufacturing a semiconductor device, the method including: patterning an initial metal structure to form a metal line and a top via thereon such that the top via is protruded from the metal line; forming at least two dielectric layers which are vertically stacked on the metal line with the top via thereon; performing $1^{st}$ planarization such that the $1^{st}$ planarization stops at a level above a top surface of the top via; and performing $2^{nd}$ planarization such that the top surface of the top via is exposed.

BRIEF DESCRIPTION OF DRAWINGS

Example embodiments of the disclosure will be more clearly understood from the following detailed description taken in conjunction with the accompanying drawings as follows.

FIGS. 1A-1C illustrate a semiconductor device including an interconnect structure, according to one or more embodiments.

FIG. 2 illustrates a semiconductor device including an interconnect structure in which a via loss has occurred to a top via.

FIG. 3 illustrates a semiconductor device including an interconnect structure in which IMD dishing has occurred.

FIGS. 5A-5I illustrate side cross-section views of a semiconductor devices including an intermediate interconnect structure after respective steps of manufacturing a semiconductor device including an interconnect structure in which an isolation layer itself is used as a planarization stop layer, according to one or more embodiments.

FIG. 7 is a block diagram of a system-on-chip (SoC) 1000 including a semiconductor device in which at least one of the interconnect structure 40 shown in FIG. 4N and the interconnect structure 50 shown in FIG. 5E is formed, according to one or more embodiments.

DETAILED DESCRIPTION

Figure 1A:
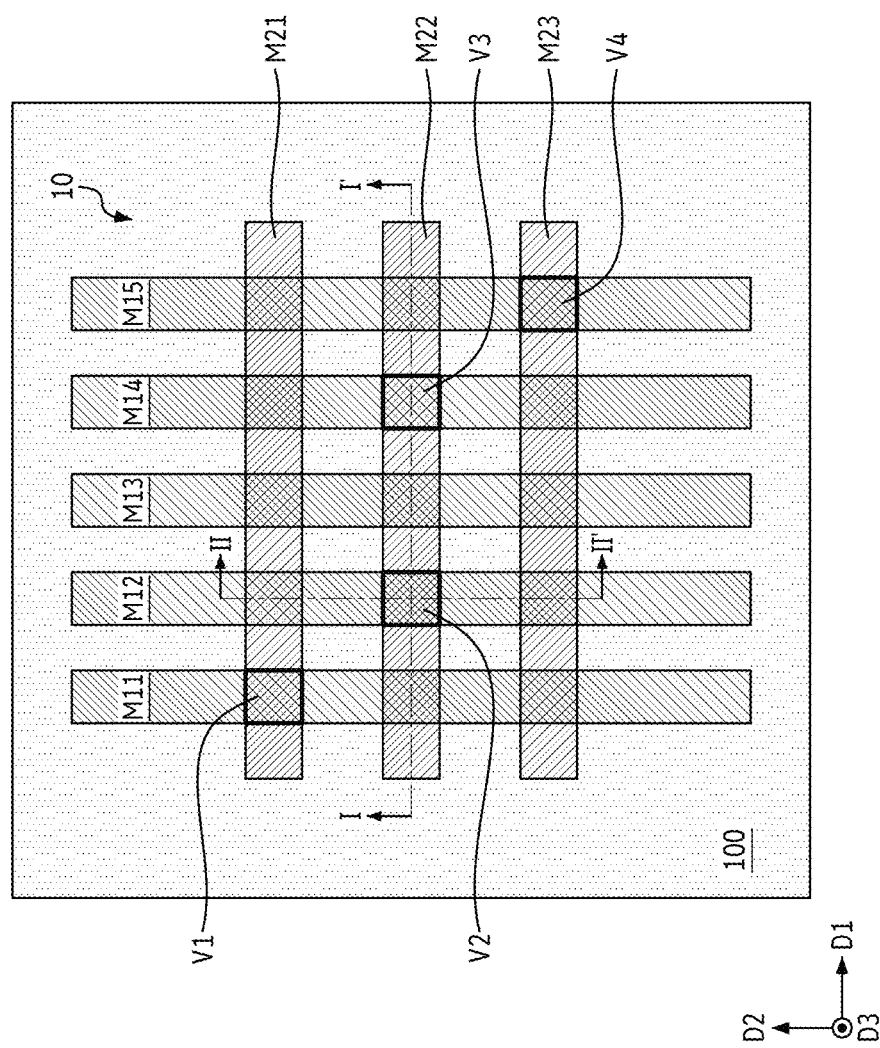

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$" etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. In one or more examples, when specifying that a parameter X may be "substantially the same" as parameter Y, the term "substantially" may be understood as X being within 5% of Y In one or more examples, when specifying that a parameter is about X, the term "about" may be understood as being within 5% of X.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements of a semiconductor device may or may not be described in detail herein or shown in the drawings. For example, MOL or FEOL structures may not be shown or described in detail when these structures are not relevant to the concept of the disclosure.

Herebelow, various embodiments of the disclosure are described in reference to the accompanying drawings.

FIGS. 1A-1C illustrate a semiconductor device including an interconnect structure, according to one or more embodiments.

FIG. 1A is a plan view of the semiconductor device, FIG. 1B is a side cross-sectional view of the semiconductor device taken along a line I-I' shown in FIG. 1A, and FIG. 1C is a side cross-section view of the semiconductor device taken along a line II-II' shown in FIG. 1A.

Referring to FIGS. 1A-1C, an interconnect structure 10 formed in a BEOL process may be disposed on a base layer 100. Here, the base layer 100 may be a BEOL layer including another interconnect structure, a middle-of-line (MOL) layer, or a front-end-of-line (FEOL) layer forming a transistor structure of a semiconductor device. According to one or more other embodiments, the base layer 100 may be a substrate or a carrier substrate.

The interconnect structure 10 may include a plurality of M1 metal lines M11-M15 at an M1 level (or M1 metal layer), a plurality of top vias V1-V4 on the M1 metal lines M11, M12, M14 and M15, and a plurality of M2 metal lines M21-M23 at an M2 level (or M2 metal layer) immediately above the M1 level in a D3 direction. The M1 metal lines, the top vias, and the M2 metal lines may be surrounded by inter-metal dielectric (IMD) layers 110 and 120, respectively, which are electrical isolation or insulation structures. It is to be understood here that FIG. 1A shows a positional relationship between the M1 metal lines M11-M15 and the M2 metal lines M21-M23 with the top vias V1-V4 therebetween, and thus, the MID layers 110 and 120 are not shown in FIG. 1A for visibility purposes.

The M1 metal lines may be arranged in a D1 direction at a predetermined pitch and extended in a D2 direction, and the M2 metal lines formed above the M1 metal lines with the top vias V1-V4 therebetween may be arranged in the D2 direction at a predetermined pitch and extended in the D1 direction. The M1 metal lines may each have a same width in the D1 direction, and the M2 metal lines may each have a same width in the D2 direction, which may be the same as or different from that of the M1 metal lines. However, the disclosure is not limited thereto. According to one or more other embodiments, the M1 metal lines and the M2 metal lines may be arranged without the predetermined pitches, and may have different widths, respectively. The D1 direction and the D2 directions are each a horizontal direction and intersect each other. The D3 direction is a vertical direction intersecting the D1 direction and the D2 direction.

The top via V1 may connect the M1 metal line M11 with the M2 metal line M21, the top via V2 may connect the M1 metal line M12 with the M2 metal line M22, the top via V3 may connect the M1 metal line M14 with the M2 metal line M22, and the top via V4 may connect the M1 metal line M15 with the M2 metal line M23.

It is noted here that the M1 metal lines may be formed in the lowest layer of the BEOL layer. However, the disclosure is not limited thereto, and there may be one or more other metal lines and vias below the M1 metal lines to form an extended interconnect structure of the semiconductor device. Further, the number of the metal lines and top vias is not limited to those shown in FIG. 1A to form the interconnect structure 10.

The interconnect structure 10 may be formed through a top via process, in which the top vias V1-V4 are formed from underlying metal lines, respectively. For example, the top via V1 may be formed from the M1 metal line M11, the top vias V2 may be formed from the M1 metal line M12, the top via V3 may be formed from the M1 metal line M14, and the top via V4 may be formed from the M1 metal line M15. Thus, each of the top vias V1-V4 may be a part of the corresponding underlying M1 metal line itself, and each of the top vias V1-V4 and the corresponding underlying M1 metal line may be a single continuum structure that does not have a boundary, a connection surface or an interface therebetween, unlike a damascene metal line and a damascene via thereon that are formed through respective damascene processes. Each of these top vias V1-V4 may take a form of a pillar-type protrusion on the underlying metal line.

The via structure like each of the top vias V1-V4 is introduced to reduce contact resistance existing between a metal line and a via formed thereon through a conventional damascene process, which adversely affects at least connection performance of a semiconductor device including the metal line and the via. At least for the foregoing purpose, and to facilitate the top via process, a metal such as ruthenium (Ru) may be patterned to form the M1 metal lines M11-M15 with the top vias V1-V4 thereon. Alternatively, molybdenum (MO) or cobalt (Co) may be patterned to form the M1 metal lines M11-M15 with the top vias V1-V4 thereon, not being limited thereto.

At a bottom surface of each of the M1 metal lines may be formed a bottom liner 101 which reduces contact resistance and provides adhesion properties between each of the M1 metal lines and an underlying structure in the base layer 100. The bottom liner 101 may be formed of a material such as titanium nitride (TiN), tantalum nitride (TaN), etc., not being limited thereto.

At a side surface of each of the M1 and M2 metal lines and the top vias may be formed a sidewall liner 102 which prevents or reduces electromigration of metal atoms (e.g., Ru) into the EIMD layer 110 which is formed of a low-k material such as silicon oxide ($SiO_2$, etc.), not being limited thereto, to isolate the M1 metal lines and the top vias from each other and isolate the M2 metal lines from each other. The sidewall liner 102 may also provide adhesion properties between the IMD layer 110 and the M1 and M2 metal lines and the top vias. The sidewall liner 102 may be formed of a material such as a composite of silicon nitride (e.g., SiCN, SiBCN, etc.), not being limited thereto. It is to be appreciated here that the sidewall liner 102 is not shown in FIG. 1A for brevity purposes.

When the M1 and M2 metal lines and the top vias are formed of ruthenium (Ru), which provides a lower resistance and a reduced electromigration property than other metal materials such as copper (Cu), the sidewall liner 102 may not be formed at the side surfaces of these metal structures. However, to more effectively prevent or reduce the electromigration of metal atoms, the sidewall liner 102 may be formed even at the side surfaces of the metal structures of the interconnect structure 10 when the metal structures are formed of ruthenium (Ru).

The interconnect structure 10 may also be formed to include one or more air gaps 113 between at least some of adjacent M1 metal lines in the EVID layer 110 using material characteristics, e.g., porosity, of the low-k material (e.g., $SiO_2$) and the small pitch of the M1 metal lines. With the air gaps 113 formed in the IMD layer 110, isolation or insulation properties between neighboring M1 metal lines and a neighboring M1 metal line and a top via may increase to further enhance interconnect performance of a semiconductor device including the interconnect structure 10. The formation of the air gaps 113 may be further facilitated by the sidewall liner 102 which reduces the already-small metal pitch.

In the meantime, in the interconnect structure 10, the M1 metal lines with the top vias thereon may be formed such that: (i) the M1 metal lines are first patterned out from an initial metal structure (e.g., Ru) through, for example, direct etching thereon; (ii) portions of the M1 metal lines where the top vias are to be formed are masked, and the M1 metal lines are recessed based on the masking to form the top vias on the M1 metal lines, respectively; (iii) the sidewall liner 102 may be optionally formed to surround the M1 metal lines with the top vias thereon; (iv) the IMD layer 110 is formed to surround the M1 metal lines with the top vias thereon; and (v) the IMD layer 110 is planarized though, for example, chemical-mechanical polishing (CMP) to expose top surfaces of the top vias though the IMD layer 110 for connection with overlying M2 metal lines.

However, as a global density of the top vias is generally very low in the interconnect structure 10, that is, the number of the top vias V1-V4 is very small, e.g., 1-3%, compared to the entire area of the interconnect structure 10, as shown in FIG. 1A, stopping the IMD planarization operation (v) applied to the IMD layer 110 immediately after the top surfaces of the top vias are detected or exposed is very difficult even if a target height of the top vias V1-V4 is known. Thus, over-polishing (e.g., over-CMP) may occur to at least one of the top vias on the M1 metal lines, resulting in a via loss to the at least one of the top vias. For example, as shown in FIG. 2, the via loss may occur to a top via V2 on an M1 metal line M12 while no via loss may occur to a top via V4 in an interconnect structure 20 which corresponds to the interconnect structure 10 of FIG. 1B. In this example, a portion of the M1 metal line M12 is recessed together with an EIMD layer 110 around the M1 metal line M12, below a level L where an M2 metal line is to be formed, because of the over-polishing. When the via loss randomly occurs in this manner, a subsequent operation of forming an overlying M2 metal line to contact the top vias may become incomplete and unreliable because of the different heights of the top vias.

In another example, top vias may be early detected in an IMD planarization operation (v) to timely stop this operation and expose the top surfaces of the top vias, thereby preventing the via loss. However, in this example as shown in FIG. 3, an IMD dishing may occur to an IMD layer 110 of an interconnect structure 30 corresponding to the interconnect structure 10 of FIG. 1B because of difference in rigidity and etch selectivity between a low-k dielectric material (e.g., $SiO_2$) forming the IMID layer 110 and a metal material (e.g., Ru) forming top vias V2 and V3. When the IMD dishing occurs, the IMD layer 110 may be over-etched outwardly from the top vias V2 and V3 and thus, a top surface of the IMD layer 110 may become concave between and at the sides of the top vias V2 and V3. As a result of the IMD dishing, a short-circuit risk may increase between the M1 metal lines below the over-etched portion of the IMD layer 110 and an overlying M2 metal line or any other circuit elements that are to be formed above the over-etched EVID layer 110.

The foregoing problems of via loss and IMD dishing and other related problems may be caused by the difficulty in the planarization operation (e.g., CMP) applied to the interconnect structures 20 and 30 including the M1 metal lines with the low-density top vias formed thereon.

Embodiments presented herebelow address the above-described problems in the interconnect structures 20 and 30 of the semiconductor device.

Figure 4B:
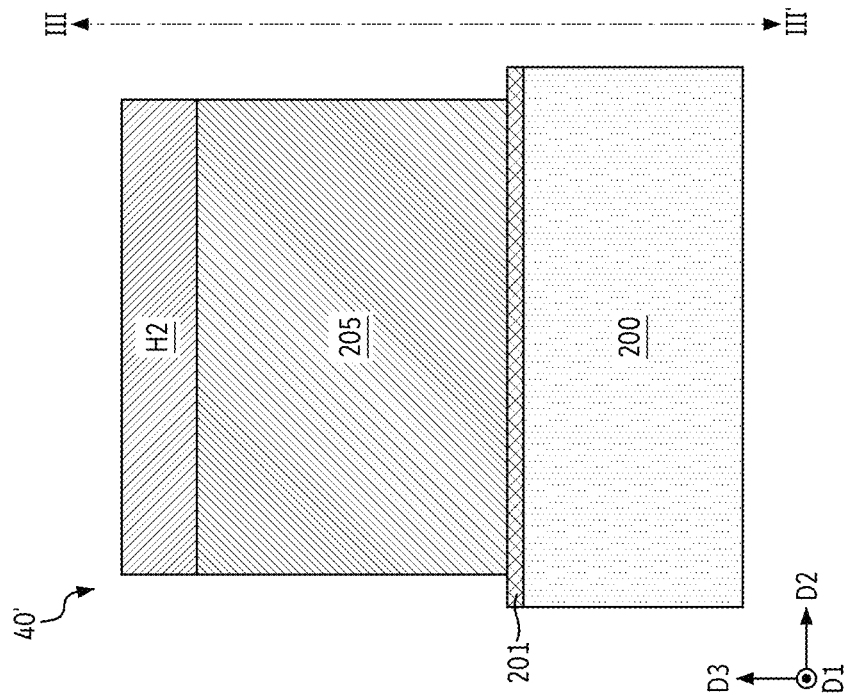
FIGS. 4A-4R illustrate side cross-section views of a semiconductor device including an intermediate interconnect structure after respective steps of manufacturing a semiconductor device including an interconnect structure in which a planarization stop layer is formed in an isolation layer, according to one or more embodiments.
Figure 4A:
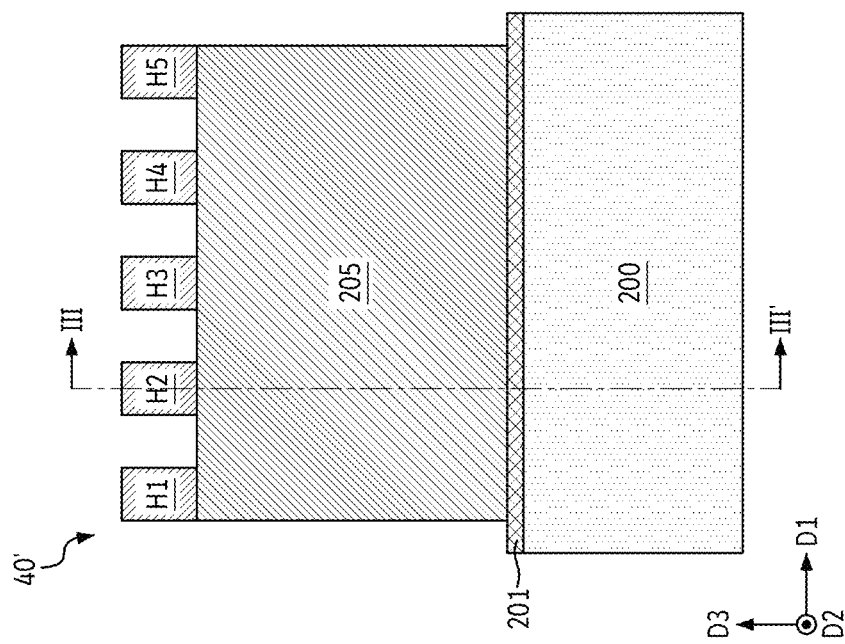
Figure 4C:
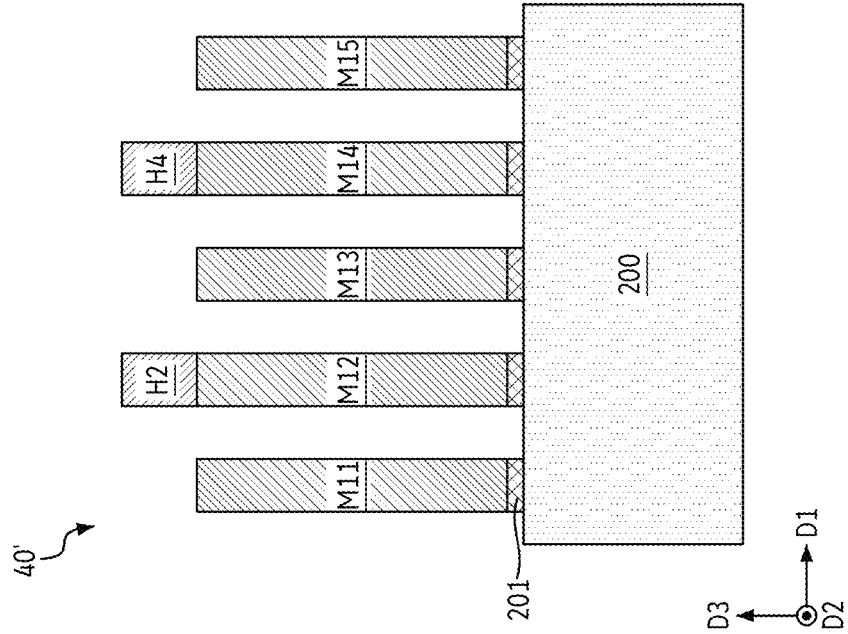
Figure 4D:
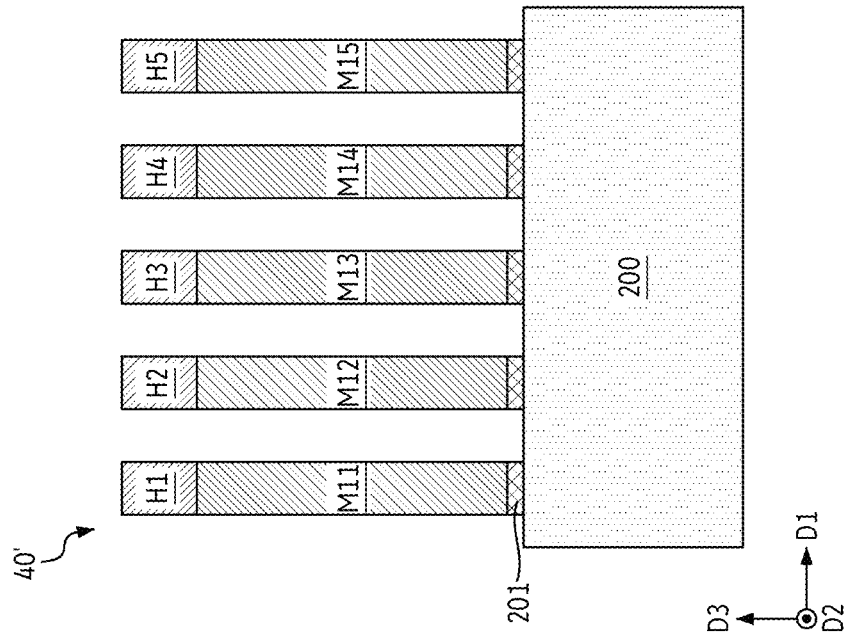
Figure 4E:
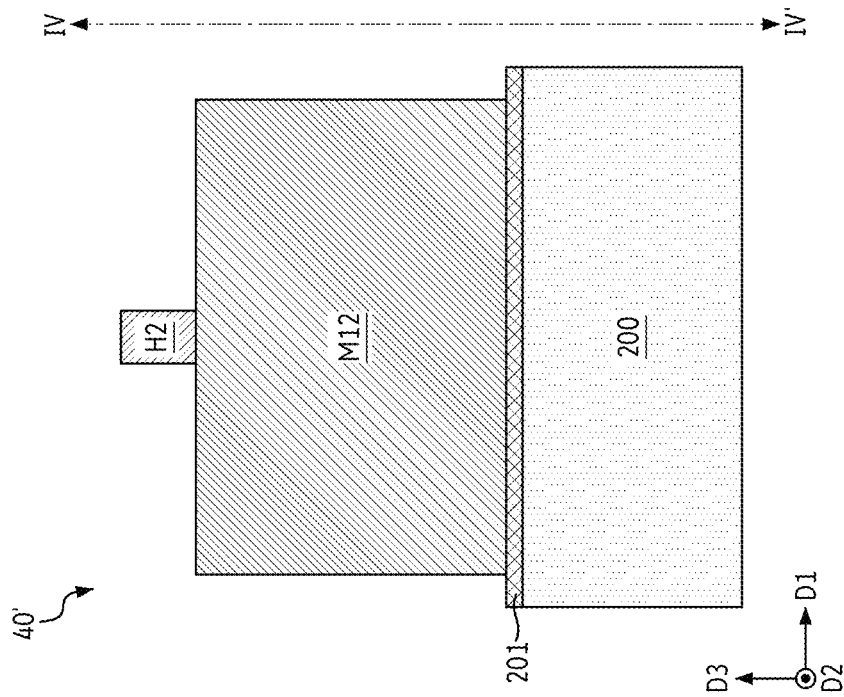
Figure 4F:
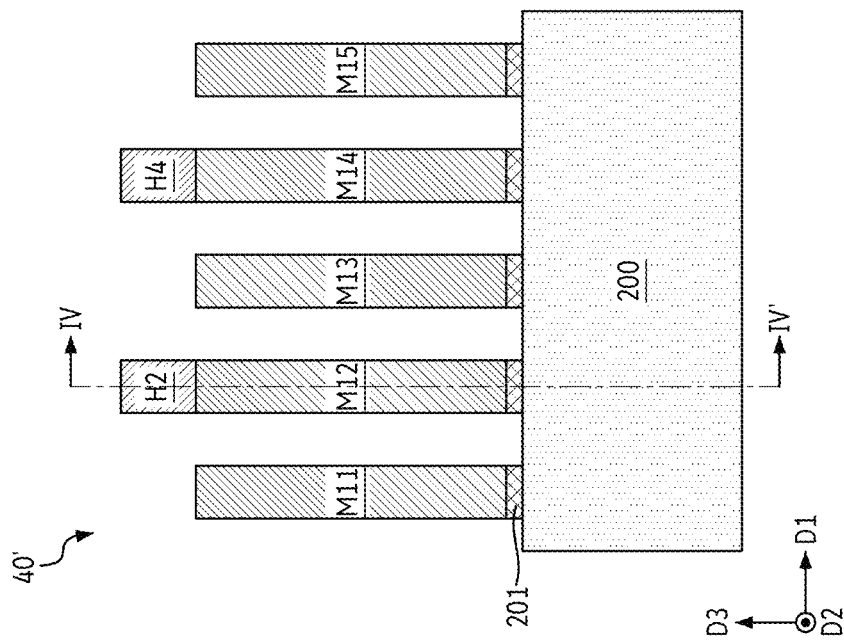
Figure 4G:
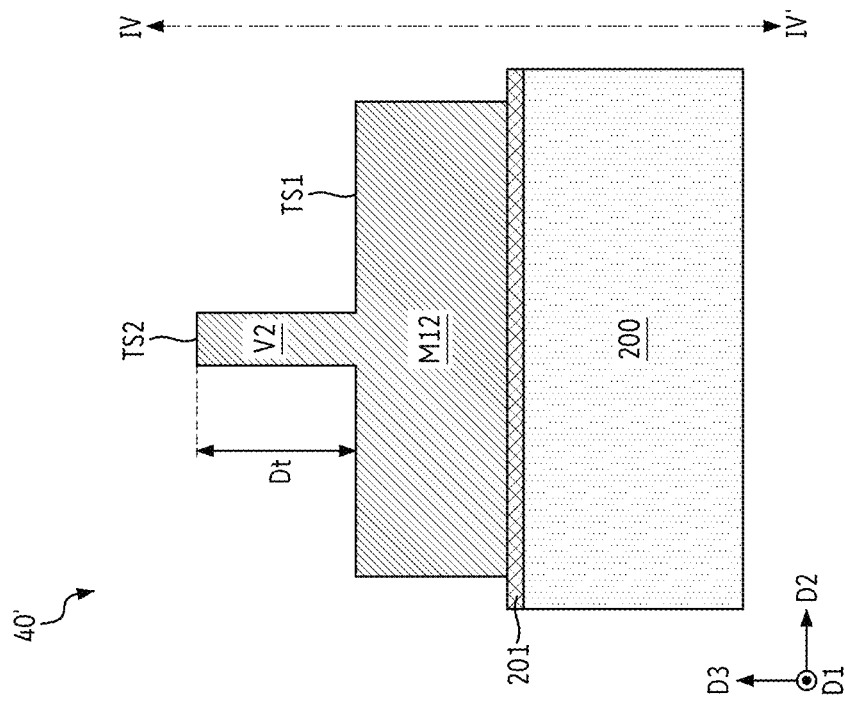
Figure 4H:
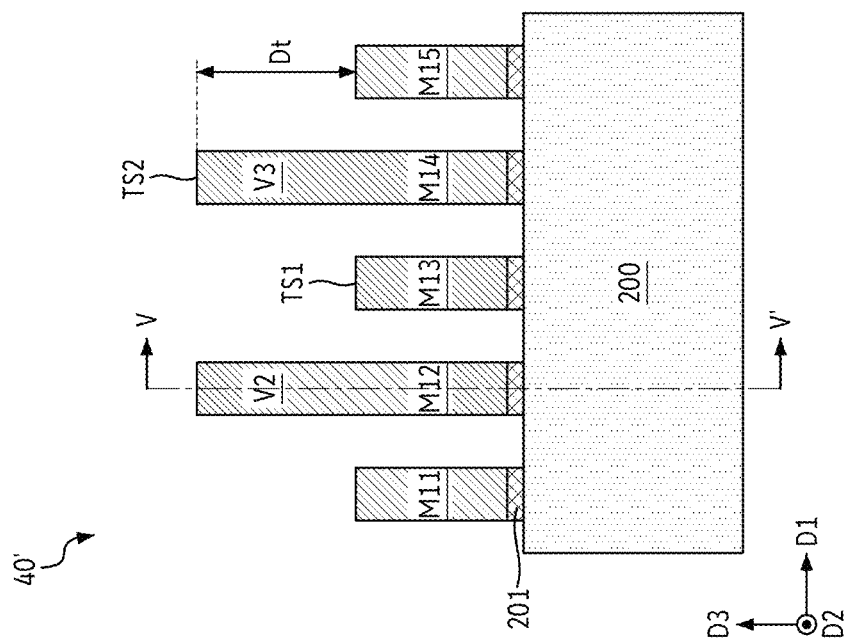
Figures 4K, 4L:
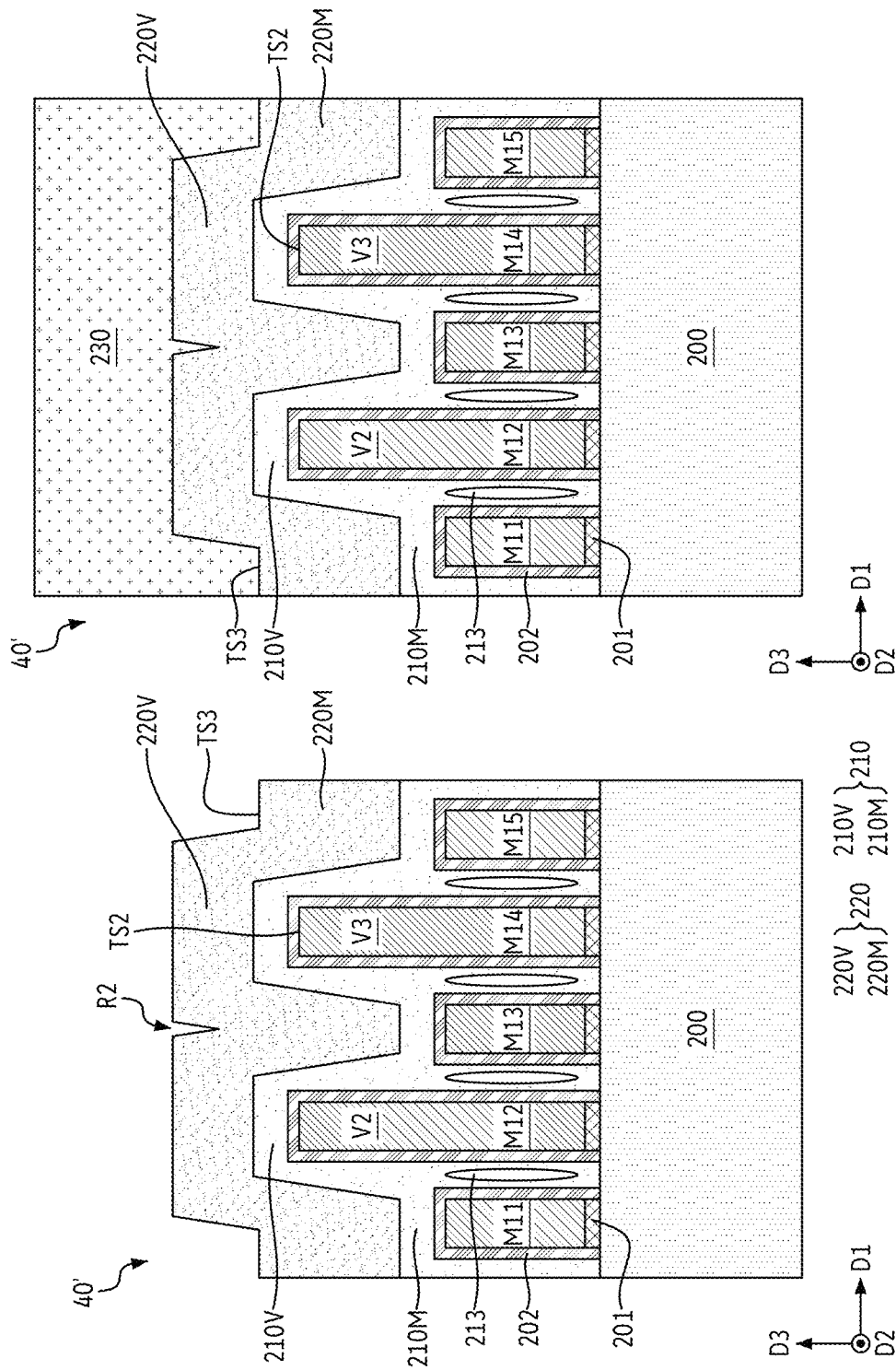
Figure 40:
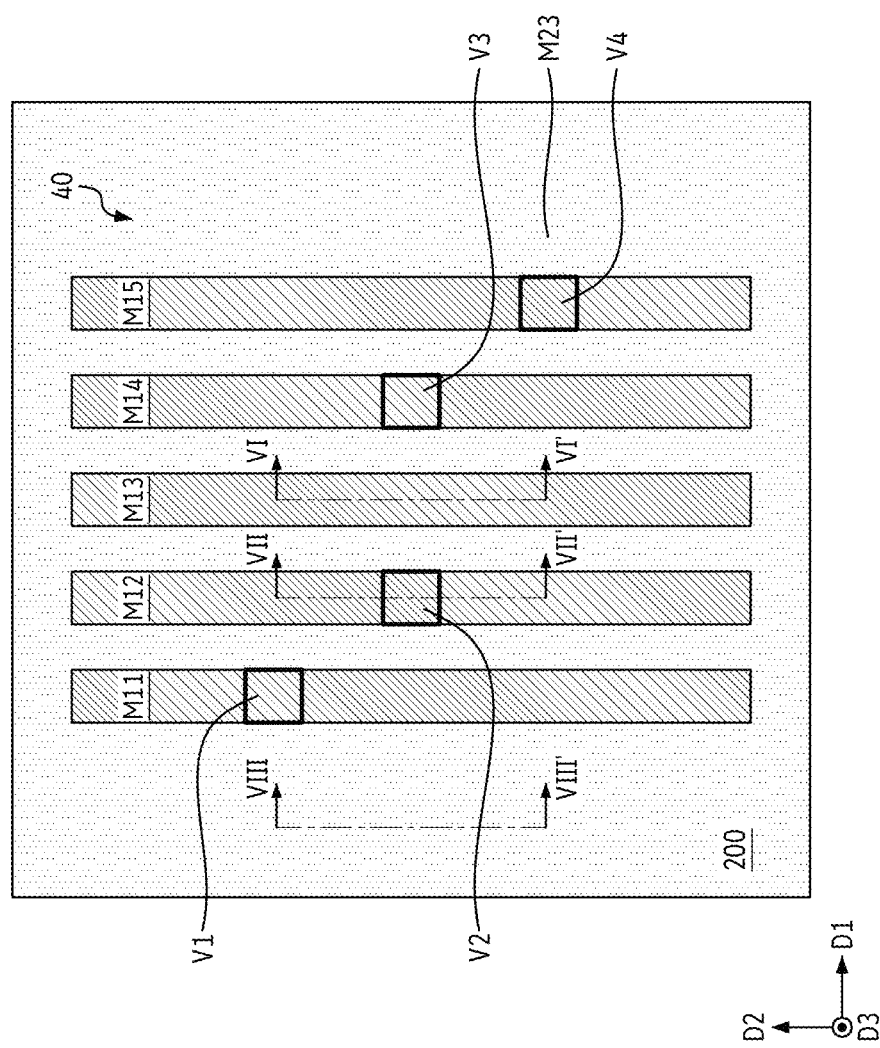
Figure 4R:
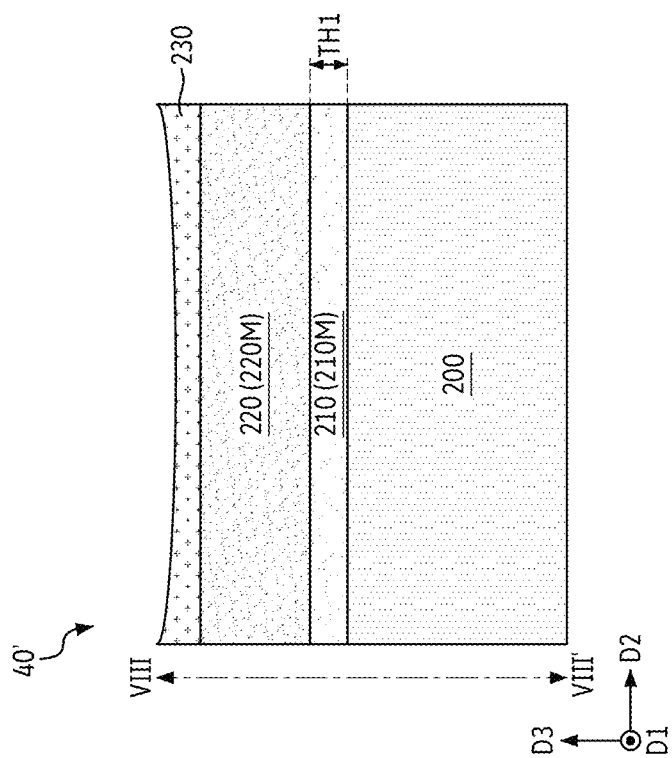

FIGS. 4A-4R illustrate side cross-section views of a semiconductor device including an intermediate interconnect structure after respective steps of manufacturing a semiconductor device including an interconnect structure in which a planarization stop layer is formed in an isolation layer, according to one or more embodiments.

It is to be understood here that the side cross-section views of the semiconductor devices shown in FIGS. 4A, 4C-4E, and 4G-4N are taken in the D1 direction in which the side-cross section view of the intermediate semiconductor shown in FIG. 1B are taken, and the side cross-section views of the semiconductor devices shown in FIGS. 4B, 4F, 4H and 4P-4R are taken in the D2 direction in which the side-cross section view of the semiconductor device shown in FIG. 1C are taken.

It is further to be understood that a base layer, a bottom liner, a plurality of M1 metal lines and top vias patterned on the base layer, a sidewall liner, and air gaps to be described herebelow in reference to FIGS. 4A-4R may be the same as or similar to the base layer 100, the bottom liner 101, the M1 metal lines M11-M15 and the top vias V2 and V3, the sidewall liner 102, and the air gaps 113 described in reference to FIGS. 1A-1C. Thus, duplicate descriptions thereof may be omitted herebelow.

Referring to FIGS. 4A and 4B, an initial metal structure 205 may be formed on a base layer 200 of a semiconductor device with a bottom liner 201 therebetween to form an intermediate interconnect structure 40'. The initial metal structures 205 may extend in the D1 direction and the D2 direction on the base layer 200 which may be at least one of an FEOL layer, an MOL layer and another BEOL layer. The initial metal structure 205 may be ruthenium (Ru), for example.

Prior to formation of the initial metal structure 205 on the base layer 100, the bottom liner 201, which may be the same or similar to the bottom liner 201 of FIGS. 1A-1C, may be layered on a top surface of the base layer 100 through, for example, atomic layer deposition (ALD), not being limited thereto. Then, the initial metal structure 205 may be formed on the bottom liner 201 through, for example, physical vapor deposition (PVD), chemical vapor deposition (CVD), plasma-enhanced chemical vapor deposition (PECVD), or any other deposition process, and planarized through, for example, chemical-mechanical polishing (CMP).

A plurality of hard mask patterns H1-H5 may be formed on a top surface of the initial metal structure 205 through, for example, a photolithography and masking operation at positions on the top surface of the initial metal structure 205 below which corresponding M1 metal lines are to be respectively patterned in a next step (FIG. 4B). The hard mask patterns H1-H5 may be arranged in the D1 direction at a same pitch of the corresponding M1 metal lines. Further, each of the hard mask patterns H1-H5 may be extended in the D2 direction on the initial metal structure 205 as shown in FIG. 4B which is a side cross-section view taken along a line III-III' shown in FIG. 4A.

A material or material composition forming the hard mask patterns HM1-HM5 may be silicon nitride (e.g., $Si_3N_4$) or silicon dioxide (e.g., $SiO_2$), not being limited thereto.

Referring to FIG. 4C, the initial metal structure 205 and the bottom liner 201 thereunder may be patterned based on the hard mask patterns H1-H5 to form a plurality of M1 metal lines M11-M15 arranged in the D1 direction and extended in the D2 direction at an M1 layer.

The formation of the M1 metal lines M11-M15 may be performed through, for example, dry etching (e.g., reactive ion etching, plasma etching, ion beam etching, or laser ablation), which is a direct etching, not being limited thereto. Along with the initial metal structure 205, the bottom liner 201 may also be patterned to expose the top surface of the base layer 100 between the M1 metal lines.

Referring to FIG. 4D, the hard mask patterns H1, H3 and H5 among the hard mask patterns H1-H5 may be removed from the M1 metal lines M11, M13 and M15, respectively, while the hard mask pattern H2 and H3 remain on the M1 metal lines M12 and M14, respectively.

The hard mask patterns H1, H3 and H5 may be selectively removed in this step to expose top surfaces of the M1 metal lines M11, M13 and M15 so that these M1 metal lines can be recessed from the top surfaces thereof in a next step (FIG. 4E). The selective removal operation of the hard mask patterns H1, H3 and H5 may be performed through, for example, dry etching, ashing or stripping, not being limited thereto.

Referring to FIGS. 4E and 4F, the hard mask patterns H2 and H4 on the M1 metal lines M12 and M14 may be patterned so that the hard mask patterns H2 and M4 may remain at positions on top surfaces of the M1 metal lines M12 and M14 below which corresponding top vias are to be respectively patterned in a next step (FIGS. 4G-4H).

For example, the hard mask pattern H2 may be patterned on the M1 metal line M12 as shown in FIG. 4F which is a side cross-section view taken along a line IV-IV' shown in FIG. 4E. Compared to FIG. 4B, FIG. 4F shows that the hard mask pattern H2 is partially removed except a portion below which a top via is to be formed in a next step (FIGS. 4G and 4H). The hard mask pattern H4 may also be patterned on the M1 metal line M14 to take the same shape as the hard mask pattern H2. The patterning of the hard mask patterns H2 and H4 in this step may be performed through, for example, another photolithography and masking operation, not being limited thereto.

Referring to FIGS. 4G and 4H, the M1 metal lines M11-M15 may be patterned by a predetermined depth Dt based on the hard mask patterns H2 and H4 patterned in the previous step (FIGS. 4E and 4F).

Based on the hard mask patterns H2 and H4, the M1 metal lines M11-M15 may be direct-etched through, for example, dry etching (e.g., reactive ion etching, plasma etching, ion beam etching, or laser ablation), not being limited thereto by the predetermined depth Dt.

As a result of the patterning operation in this step, heights of the M1 metal lines M11, M13 and M15, from which the hard mask patterns H11, H13 and H15 are removed in the previous step (FIG. 4D), may be shortened by the predetermined depth Dt, and heights of portions of the M1 metal lines M12 and M14 not masked by the hard mask patterns H2 and H4 may also be shortened by the predetermined depth Dt, and thus, the two top vias V2 and V4 may be formed on the patterned M1 metal lines M12 and M14, respectively. Here, the top vias V2 and V3 may have the predetermined depth Dt as their heights from top surface TS1 of the M1 metal lines M12 and M14, respectively, of which the heights are shortened by the predetermined depth Dt to top surfaces TS2 of the top vias V2 and V4. For example, the M1 metal line M12 may be patterned to form the top via V2 thereon as shown in FIG. 4H which is a side cross-section view taken along a line V-V' shown in FIG. 4G. The M1 metal line M14 may also be patterned to form thereon the top via V4 which may have the same shape as the top via V2.

As the M1 metal lines M11-M15 and the top vias V2 and V3 are formed in this manner, the M1 metal lines may all have shortened heights and the top surfaces T1 may all be at a same level, and the top vias V2 and V3 may be formed in a protrusion form from the top surfaces TS1 of the M1 metal lines M12 and M14, respectively. The patterning of the M1 metal lines M11-M15 based on the hard mask patterns H2 and H4 may be performed through, for example, dry etching, not being limited thereto.

It is to be understood here that additional top vias V1 and V4, which correspond to the top vias V1 and V4 shown in FIG. 1A, may also be formed on the M1 metal lines M11 and M15 which are not shown in the side cross-section view of FIG. 4G. Thus, even if these two top vias are not mentioned herebelow, the descriptions about the top vias V2 and V3 shown in FIG. 4H may also apply to the top vias V1 and V4.

Referring to FIG. 4I, a sidewall liner 202 may be formed on an outer surface of each of the M1 metal lines M11-M15 and the top vias V2-V3.

As described above in reference to FIGS. 1A-1C, the sidewall liner 202 may prevent or reduce electromigration of metal atoms of the M1 metal lines M11-M15 and the top vias V2 and V3 into an isolation layer of a low-k material to be formed in a next step (FIG. 4J) to isolate the M1 metal lines and the top vias from each other and other circuit elements. The sidewall liner 202 may also provide adhesion properties between the isolation layer and the M1 metal lines and the top vias.

The formation of the sidewall liner 202 may be performed through, for example, atomic layer deposition (ALD) of a silicon nitride composite (e.g., SiCN, SiBCN, etc.), not being limited thereto, on the top surfaces and side surfaces of the M1 metal lines and the top vias.

Alternatively, as describe above in reference to FIGS. 1A-1C, when the initial metal structure 205 from which the M1 metal lines and the top vias are formed is ruthenium (Ru), which provides a lower resistance and a reduced electromigration property than other metal materials such as copper (Cu), the sidewall liner 202 may not be formed at the side surfaces of the M1 metal lines and the top vias.

Referring to FIG. 4J, an isolation layer 210, which may be an IMD layer, may be formed on the M1 metal lines M11-M15 and the top vias V2-V3 to isolate these metal lines and top vias from each other or other circuit elements.

The formation of the isolation layer 210 may be performed through, for example, depositing a $1^{st}$ isolation material, which may be a dielectric material such as silicon oxycarbide (e.g., SiOC, etc. having a low-k value) or silicon oxide (e.g., $SiO_2$), along an outer profile of the M1 metal lines M11-M15 and the top vias V2 and V3 by a vertical thickness TH1 in the D3 direction using at least one of CVD, PVD, PECVD, and ALD, not being limited thereto. Thus, an outer profile of the isolation layer 210 may take a shape similar to that of the M1 metal lines and the top vias thereon.

For example, a $1^{st}$ portion 210V the isolation layer 210, which is an upper portion of the isolation layer 210, corresponds to and is similar to the profile of each of the top vias, may take a form of protrusion from a $2^{nd}$ portion 210M of the isolation layer 210, which is a lower portion of the isolation layer 210, corresponds to the M1 metal lines and is similar to the profile of the M1 metal lines. Thus, a recess R1 may be formed between two adjacent protrusions, that is, the $1^{st}$ portions 210V. Further, the number of the protrusions, that is, the $1^{st}$ portions 210V, of the isolation layer 210 may be equal to the number of the top vias formed in the intermediate interconnect structure 40'. Accordingly, a global density of the protrusions in an entire area of the isolation layer 210 may be very low, which is similar to that of the top vias (e.g., 1-3%), compared to an entire area of the isolation layer 210 in a plan view.

Due to this protrusion form, a top surface of the $1^{st}$ portion 210V of the isolation layer 210 may be at a level higher than a top surface of the $2^{nd}$ portion 210M of the isolation layer 210. As the $1^{st}$ portion 210V is formed to surround each of the top vias, a width of the 1st portion 210V may be greater than that of the top via in the D1 direction.

Further, the isolation layer 210 may be formed such that one or more air gaps 113 may be formed in the $2^{nd}$ portion 210M of the isolation layer 210 between at least some of adjacent M1 metal lines using material characteristics, e.g., porosity, of the low-k material and the small pitch of the M1 metal lines. With the air gaps 213 formed in the isolation layer 210, isolation or insulation properties between the adjacent M1 metal lines and between an M1 metal line and an adjacent top via may increase to further enhance interconnect performance of a semiconductor device including an interconnect structure formed from the intermediate interconnect structure 40'. The formation of the air gaps 213 may be further facilitated by the sidewall liner 202 which reduces the already-small metal pitch. The air gap may be formed in the form of a single void or a plurality of voids or pores according to one or more other embodiments. Also, the air gap may not be formed in the spaces between some of the M1 metal lines according to one or more other embodiments.

In the meantime, even when the sidewall liner 202 is not formed to surround the M1 metal lines and the top vias, the isolation layer 210 may be formed to surround the M1 metal lines and the top vias such that the air gaps 213 are still formed as described above.

Referring to FIG. 4K, a planarization stop layer 220 may be formed on the isolation layer 210.

The planarization stop layer 220 may be termed as such because this layer will be used to stop a planarization operation applied to the intermediate interconnect structure 40' in a later step (FIG. 4M).

The formation of the planarization stop layer 220 may be performed through, for example, a $2^{nd}$ isolation material which may be a dielectric material such as silicon nitride (e.g., SiN, $Si_3N_4$, etc.), which is different from the $1^{st}$ isolation material forming the isolation layer 210, along an outer profile of the isolation layer 210 using at least one of CVD, PVD, PECVD, and ALD, not being limited thereto. Thus, an outer profile of the planarization stop layer 220 may take a shape similar to that of the isolation layer 210 on the M1 metal lines and the top vias.

For example, a $1^{st}$ portion 220V of the planarization stop layer 220 formed to surround the $1^{st}$ portion 210V of the isolation layer 210 may take a form of protrusion from a $2^{nd}$ portion 220V of the planarization stop layer 220 formed on the $2^{nd}$ portion 210M of the isolation layer 210. Thus, a recess R2 may be formed between two neighboring protrusions, that is, the $1^{st}$ portions 220V Further, the number of the protrusions, that is, the $1^{st}$ portions 220V, of the planarization stop layer 220 may be equal to the number of the $1^{st}$ portions 210V of the isolation layer 210, and the number of the top vias formed in the intermediate interconnect structure 40'. Accordingly, a global density of the protrusions in an entire area of the planarization stop layer 220 may be the same as or similar to that of the protrusion in the entire area of the isolation layer 210.

Due to this protrusion form, a top surface of the $1^{st}$ portion 220V of the planarization stop layer 220 may be at a level higher than a top surface TS3 of the $2^{nd}$ portion 220M of the planarization stop layer 220. As the $1^{st}$ portion 220V of the planarization stop layer 220 is formed to surround the $1^{st}$ portion 210V of the isolation layer 210, a width of the 1st portion 220V may be greater than that of the $1^{st}$ portion 210V in the D1 direction. Thus, the recess R3 formed between the two neighboring $1^{st}$ portions 220V may also be smaller than the recess R2 formed between the two neighboring $1^{st}$ portions 210V in width in the D1 direction and in height in the D3 direction.

The planarization stop layer 220 may be formed such that the top surface TS3 of the $2^{nd}$ portion 220M is at a level higher than the top surface TS2 of the top vias for planarization stop purposes, which will be described later in reference to FIG. 4M.

Referring to FIG. 4L, an overburden layer 230 may be formed on the planarization stop layer 220.

The formation of the overburden layer 230 may be performed through, for example, depositing a $3^{rd}$ isolation material, which may be a dielectric material such as silicon oxide (e.g., $SiO_2$, etc.), which is different from the isolation materials respectively forming the isolation layer 210 and the planarization stop layer 220, on the planarization stop layer 220 using at least one of CVD, PVD, PECVD, and ALD, not being limited thereto. However, unlike the planarization stop layer 220, the overburden layer 230 may not necessarily be formed to have an outer profile similar to the underlying structure, that is, the planarization stop layer 220 of which the outer profile is similar to the isolation layer 210. This is at least because the recess R2 formed between the two adjacent two protrusions, that is, the $1^{st}$ portions 220V, of the planarization stop layer 220 is smaller than the recess R2 formed between the two adjacent protrusions, that is, the $1^{st}$ portions 210V, of the isolation layer 210. Thus, the $3^{rd}$ isolation material for the overburden layer 230, when deposited on the planarization stop layer 220, may simply fill the recess R2 without taking a protrusion form above the $1^{st}$ portions 220V of the planarization stop layer 220.

The $3^{rd}$ isolation material for the overburden layer 230 may be the same as the 1st isolation material for the isolation layer 210 when the $1^{st}$ isolation material is silicon oxide (e.g., $SiO_2$), according to one or more other embodiments.

Referring to FIG. 4M, $1^{st}$ planarization may be performed on the intermediate interconnect structure 40' obtained in the previous step (FIG. 4L) until the top surface TS3 of the $2^{nd}$ portion 220M of the planarization stop layer 220 is exposed.

As described above in reference to FIGS. 2 and 3, when a single IMD layer is formed to surround the M1 metal lines, a planarization operation is very difficult and a risk of via loss and via dishing occurs. However, when planarization is performed on the intermediate interconnect structure 40' including the planarization stop layer 220 as described above, the $1^{st}$ planarization may be controlled to stop at the top surface of the $2^{nd}$ portion 220M of the planarization stop layer 220 because the global density of the $2^{nd}$ portions 220M is far higher than that of the $1^{st}$ portions 220V of the planarization stop layer 220, and thus, detection of the $2^{nd}$ portions 220M is much easier than the $1^{st}$ portions 220V in the $1^{st}$ planarization.

For example, a CMP operation for the planarization beginning from a top portion of the overburden layer 230 may not stop at the top surfaces of the $1^{st}$ portions 220V of the planarization stop layer 220 because of the very low density of the $1^{st}$ portions 220V. However, when the CMP operation reaches at the top surfaces TS3 of the $2^{nd}$ portions 220M, the CMP operation may detect a significant change in a spectrum of isolation material (from the $3^{rd}$ isolation material to the $2^{nd}$ isolation material), and thus, the CMP operation may be controlled to stop at the top surfaces TS3 of the $2^{nd}$ portions 220V of the planarization stop layer 220 which are at a level higher than the top surfaces TS2 of the top vias V2 and V3.

Referring to FIGS. 4N-4R, $2^{nd}$ planarization may be performed on the intermediate interconnect structure 40' in the previous step (FIG. 4M) to obtain an interconnect structure 40 in a finished form including the M1 metal lines with the top vias thereon, the isolation layer 210, the planarization stop layer 220 and the overburden layer 230.

As a height of the intermediate interconnect structure 40' has become sufficiently reduced above the top surfaces TS2 of the top vias V2 and V3 in the previous step, the $2^{nd}$ planarization such as a CMP operation may be easily performed to obtain the interconnect structure 40 which exposes the top surface TS2 of the top vias V2 and V3 without via loss or IMD dishing described in FIGS. 2 and 3. The $2^{nd}$ planarization in this step may be performed based on at least one of the heights of the top vias and the M1 metal lines which may be previously known, for example, from a design specification and measurement at the step of FIG. 4G.

As a result of the $2^{nd}$ planarization, the exposed top surfaces TS2 of the top vias V2 and V3 may be horizontally (D1 and D2 directions) coplanar or aligned with top surfaces of the $1^{st}$ portions 210V of the isolation layer 210 and the $2^{nd}$ portion 220M of the planarization stop layer 220 in the interconnect structure 40. Here, the top surface of the $2^{nd}$ portion 220M of the planarization stop layer 220 after the $2^{nd}$ planarization may be at a level lower than the top surface TS3 of the $2^{nd}$ portion 220M prior to the $2^{nd}$ planarization.

According to one or more other embodiments, non-selective dry etching instead of a CMP operation may be performed as the $2^{nd}$ planarization operation to obtain the interconnect structure 40.

FIG. 4O is a plan view of FIG. 4N except the isolation layer 210, the planarization stop layer 220 and the overburden layer 230 which may obscure the positions of the M1 metal lines M11-M15 and the top vias V1-V4 in the interconnect structure 40. The sidewall liner 202 is also omitted for brevity purposes. FIGS. 4P-4R are side cross-section views taken along lines VI-VI', VII-VII' and VIII-VIII', respectively, shown in FIGS. 4N and 4O.

FIGS. 4N-4R show that the interconnect structure 40 in its finished form obtained after the $2^{nd}$ planarization may include the planarization stop layer 220 and the overburden layer 230 in addition to the isolation layer 210.

Referring to FIGS. 4N, 4P and 4Q, while the isolation layer 210 may be formed on the M1 metal lines M11-M15 and the top vias V2 and V3 to surround these metal structures, the $2^{nd}$ portion 220M of the planarization stop layer 220 may be formed vertically (D3 direction) on the $2^{nd}$ portion 210M of the isolation layer 210 and laterally (D1 and D2 directions) on the $1^{st}$ portion 210V of the isolation layer 210. Thus, in the interconnect structure 40, the height Dt of the top vias V2 and V3 may be a sum of the vertical thickness TH1 of the $2^{nd}$ portion 210M of the isolation layer 210 vertically on each of the M1 metal lines and a vertical thickness TH2 of the $2^{nd}$ portion 220M of the planarization stop layer 220 vertically on the $2^{nd}$ portion 210M of the isolation layer 210. Further, the $1^{st}$ portion 210V of the isolation layer 210 may laterally surround at least upper portions of the top vias V2 and V3, and the $2^{nd}$ portion 220M of the planarization stop layer 220 may laterally surround the $1^{st}$ portion 210V of the isolation layer 210. The planarization stop layer 220 as well as the isolation layer 210 may not be formed vertically above the top surface TS2 of each of the top vias V2 and V3 which is exposed for connection to another metal line or circuit element.

Referring to FIG. 4R, which is a side-cross section view of the line VIII-VIII' in a wide open area in the interconnect structure 40 where the M1 metal lines are not formed, the isolation layer 210, the planarization stop layer 220 and the overburden layer 230 may all be formed on the base layer 200. This is because no M1 metal lines are formed in this area, and thus, the isolation layer 210, the planarization stop layer 220 and the overburden layer 230 may be sequentially stacked. In this wide open area, the $2^{nd}$ portion 210M of the isolation layer 210 may remain without being planarized with the thickness TH1 as vertically on the M1 metal lines as shown in FIGS. 4N, 4P and 4Q, and the $2^{nd}$ portion 220M of the planarization stop layer 220 may also remain without being planarized on the $2^{nd}$ portion 210M of the isolation layer 210. However, the overburden layer 230 may have been planarized by the $1^{st}$ planarization at least to a minimal extent. Here, dishing may have occurred to the overburden layer 230 during the $1^{st}$ planarization similar to the EIMD dishing as shown in FIG. 1C. Still, however, due to the $1^{st}$ and $2^{nd}$ planarization operations, a top edge or top surface of the overburden layer 230 may be formed to be lower than a level of the top surface TS2 of the top vias in the interconnect structure 40.

In the above embodiments, the three layers 210, 220 and 230 are used to prevent via loss or planarization dishing that may occur to the formation of metal lines in a BEOL structure. However, the disclosure is not limited thereto because the via loss and planarization dishing may be prevented using more or less than three layers.

FIGS. 5A-5I illustrate side cross-section views of a semiconductor devices including an intermediate interconnect structure after respective steps of manufacturing a semiconductor device including an interconnect structure in which an isolation layer itself is used as a planarization stop layer, according to one or more embodiments.

Figure 5A:
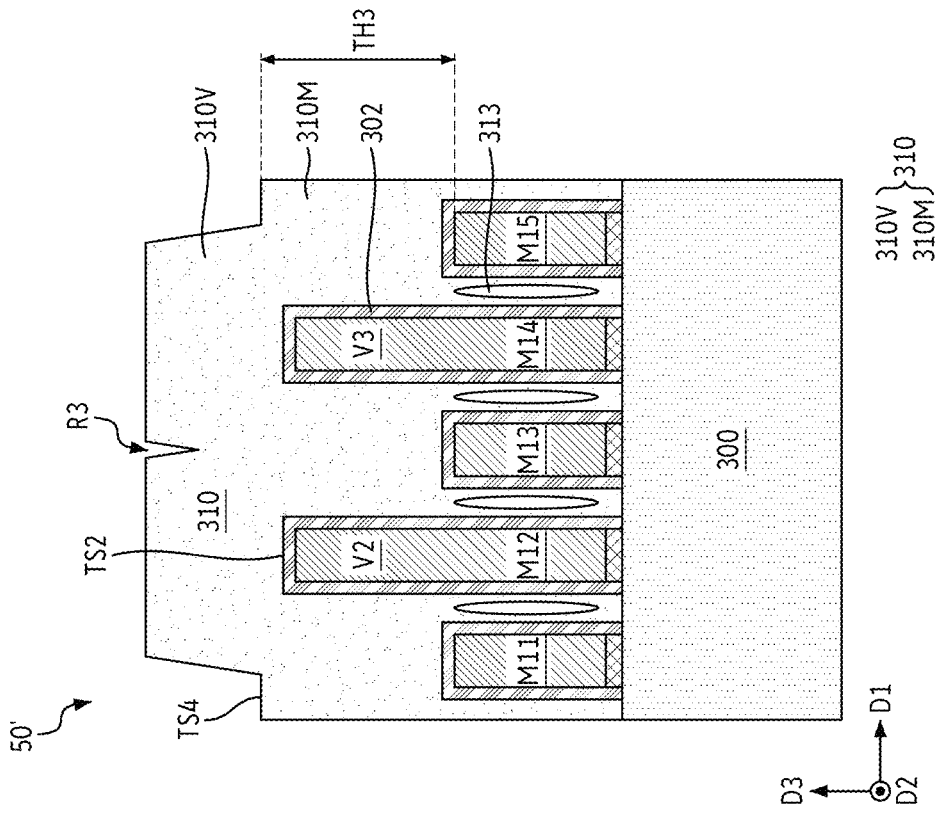

Referring to FIG. 5A, an intermediate interconnect structure 50' which may be the same as the intermediate interconnect structure 40' shown in FIG. 4G is provided on a base layer 300 with a bottom liner 301 which may also be the same as the base layer 200 with the bottom liner 201 thereon. Thus, descriptions of formation of the interconnect structure 50' shown in FIG. 5A, which are duplicate, may be omitted herebelow.

Figure 5B:
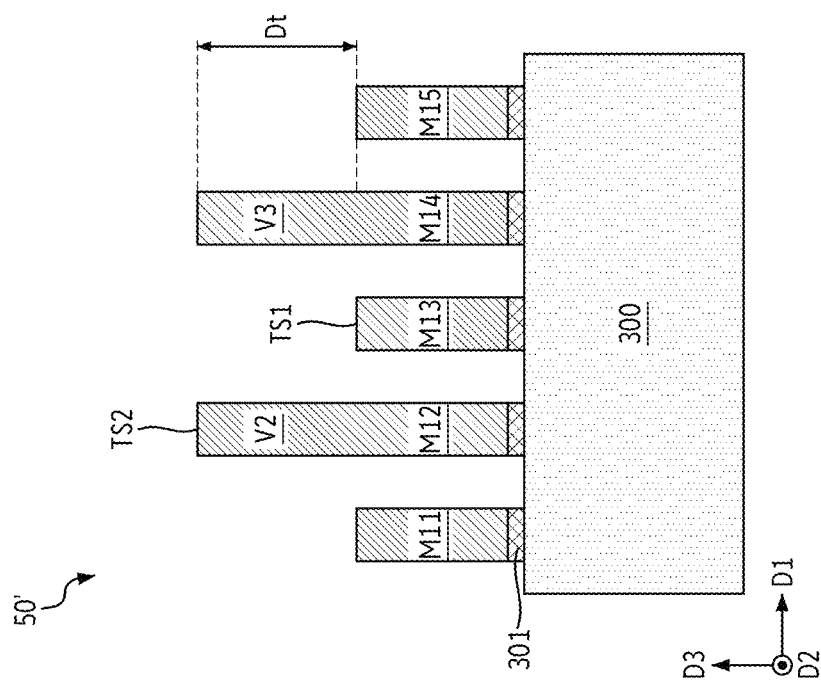

Referring to FIG. 5B, an isolation layer 310, which may be an IMD layer and a planarization stop layer, may be formed on M1 metal lines M11-M15 and top vias V2 and V3 to isolate these metal lines and top vias from each other or other circuit elements.

The formation of the isolation layer 310 may be performed such that the $1^{st}$ isolation material, which may be a dielectric material such as silicon oxycarbide (e.g., SiOC, etc. having a low-k value), is deposited on the interconnect structure 50' obtained in the previous step (FIG. 5A) along an outer profile of the M1 metal lines M11-M15 and the top vias V2-V3 by a vertical thickness TH1 in the D3 direction using at least one of CVD, PVD, PECVD, and ALD, not being limited thereto. Thus, an outer profile of the isolation layer 310 may take a shape similar to that of the M1 metal lines and the top vias thereon.

For example, a $1^{st}$ portion 310V the isolation layer 310, which is an upper portion of the isolation layer 310, corresponds to and is similar to the profile of each of the top vias, may take a form of protrusion from a $2^{nd}$ portion 310M of the isolation layer 310, which is a lower portion of the isolation layer 310, corresponds to the M1 metal lines and is similar to the profile of the M1 metal lines. Thus, a recess R3 may be formed between two adjacent protrusions, that is, the $1^{st}$ portions 310V. Further, the number of the protrusions, that is, the $1^{st}$ portions 310V, of the isolation layer 310 may be equal to the number of the top vias formed in the intermediate interconnect structure 50'. Accordingly, a global density of the protrusions in an entire area of the isolation layer 310 may be very low, which is similar to that of the top vias (e.g., 1-3%), compared to an entire area of the isolation layer 310 in a plan view.

A top surface of the $1^{st}$ portion 310V may be at a level higher than top surfaces TS2 of the top vias (or the sidewall liner 302 on the top vias) by the vertical thickness TH1 and a top surface of the $2^{nd}$ portion 310M by a height Dt of the top vias. A width of the $1^{st}$ portion 310V may be greater than that of the top via in the D1 direction.

Further, the isolation layer 310 may be formed such that one or more air gaps 313 may be formed in the $2^{nd}$ portion 310M between at least some of adjacent M1 metal lines using material characteristics, e.g., porosity, of the low-k material and the small pitch of the M1 metal lines. With the air gaps 313 formed in the isolation layer 310, isolation or insulation properties between the adjacent M1 metal lines and between an M1 metal line and an adjacent top via may increase to further enhance interconnect performance of a semiconductor device including an interconnect structure formed from the intermediate interconnect structure 50'. The formation of the air gaps 313 may be further facilitated by the sidewall liner 302 which reduces the already-small metal pitch. The air gap may be formed in the form of a single void or a plurality of voids or pores according to one or more other embodiments. Also, the air gap may not be formed in the spaces between some of the M1 metal lines according to one or more other embodiments.

In the meantime, even when the sidewall liner 302 is not formed to surround the M1 metal lines and the top vias, the isolation layer 310 may be formed to surround the M1 metal lines and the top vias such that the air gaps 313 are still formed as described above..

In the intermediate interconnect structure 50', the isolation layer 310 may also be used as a planarization stop layer in a later step (FIG. 5D), unlike the isolation layer 210 in the intermediate interconnect structure 40' shown in FIG. 4J. For this purpose, the isolation layer 310 may be deposited to surround the interconnect structure 50' obtained in the previous step by a vertical thickness TH3 of the isolation layer 310 which may be greater than the vertical thickness TH1 of the isolation layer 210 formed in the interconnect structure 40' as shown in FIG. 4J. Still, however, the outer profile of the isolation layer 310 may be similar to that of the planarization stop layer 220 formed in the interconnect structure 40' shown in FIG. 4K. Further, a top surface TS4 of the $2^{nd}$ portion 310M of the isolation layer 310 may be formed to be at a level above the top surfaces TS2 of the top vias. Further, the recess R3 formed between two adjacent $1^{st}$ portions 310V of the isolation layer 310 corresponding to the top vias V2 and V3 may take a similar shape as the recess R2 formed between the two adjacent $1^{st}$ portions 220V of the planarization stop layer 220 of the interconnect structure 40' as shown in FIG. 4K.

Referring to FIG. 5C, an overburden layer 320 may be formed on the $1^{st}$ dl 310.

The formation of the overburden layer 320 may be similar to the formation of the overburden layer 230 of the intermediate interconnect structure 40' shown in FIG. 4L, and thus, the overburden layer 320 may take a similar shape to the overburden layer 230 of the intermediate interconnect structure 40'.

The overburden layer 320 may be formed through, for example, depositing the $3^{rd}$ isolation material, which may be a dielectric material such as silicon oxide (e.g., $SiO_2$, etc.), different from the $1^{st}$ isolation material forming the isolation layer 310, on the isolation layer 310 using at least one of CVD, PVD, PECVD, and ALD, not being limited thereto. According to one or more other embodiments, the $2^{nd}$ isolation material forming the overburden layer 320 may be another dielectric material such as silicon nitride (e.g., SiN, $Si_3N_4$, etc.), which may be the same as or similar to the $2^{nd}$ isolation material forming the planarization stop layer 220 of the intermediate interconnect structure 40' shown in FIG. 4K.

Referring to FIG. 5D, $1^{st}$ planarization may be performed on the intermediate interconnect structure 50' obtained in the previous step (FIG. 5C) until the top surface TS4 of the $2^{nd}$ portion 310M of the isolation layer 310 is exposed.

Similar to the $1^{st}$ planarization performed on the interconnect structure 40' as shown in FIG. 4M, the $1^{st}$ planarization on the interconnect structure 50' in this step may be performed based on the isolation layer 310 which is a planarization stop layer.

As described earlier, the $1^{st}$ portions 310V of the isolation layer 310 has the same outer profile as the top vias V2 and V3, and thus, the global density of the $1^{st}$ portions 310V with respect to the entire area of the isolation layer 310 may be similar to that of the top vias, which may be very low, e.g., 1-3%, with respect to the entire area of the intermediate interconnect structure 50'. Thus, the $1^{st}$ planarization may be controlled to stop at the top surface of the $2^{nd}$ portion 310M of the isolation layer 310 which has a far higher density than the $1^{st}$ portion 310V of the isolation layer 310.

For example, a CMP operation for the planarization beginning from a top portion of the overburden layer 320 may not stop at the top surfaces of the $1^{st}$ portions 310V of the isolation layer 310 because of the very low density of the $1^{st}$ portion 310V. However, when the CMP operation reaches at the top surfaces TS4 of the $2^{nd}$ portions 320V, the CMP operation may detect a significant change in a spectrum of dielectric material (from the $3^{rd}$ isolation material to the $1^{st}$ isolation material), and thus, the CMP operation may be controlled to stop at the top surfaces TS4 of the $2^{nd}$ portions 310V of the isolation layer 310.

Referring to FIGS. 5E-5I, $2^{nd}$ planarization may be performed on the intermediate interconnect structure 50' in the previous step (FIG. 5D) to obtain an interconnect structure 50 in a finished form including the isolation layer 310 and overburden layer 320.

As a height of the intermediate interconnect structure 50' has become sufficiently reduced above the top surfaces TS2 of the top vias V2 and V3 in the previous step, the $2^{nd}$ planarization such as a CMP operation in this step may be easily performed to obtain the interconnect structure 50 which exposes the top surfaces TS2 of the top vias V2 and V3 without via loss or IMD dishing described in FIGS. 2 and 3. The $2^{nd}$ planarization in this step may be performed based on at least one of the heights of the M1 metal lines M11-M15 and the top vias V2 and V3 which may be previously known, for example, from a design specification and measurement at the step of FIG. 5A.

As a result of the $2^{nd}$ planarization, the exposed top surfaces TS2 of the top vias V2 and V3 may be horizontally (D1 and D2 directions) coplanar or aligned with top surfaces of the $2^{nd}$ portion 310M of the isolation layer 310 in the interconnect structure 50. Here, the top surface of the $2^{nd}$ portion 310M of the isolation layer 310 after the $2^{nd}$ planarization may be at a level lower than the top surface TS4 of the $2^{nd}$ portion 310M prior to the $2^{nd}$ planarization.

According to one or more other embodiments, non-selective dry etching instead of a CMP operation may be performed as the $2^{nd}$ planarization operation to obtain the interconnect structure 50.

Figure 5E:
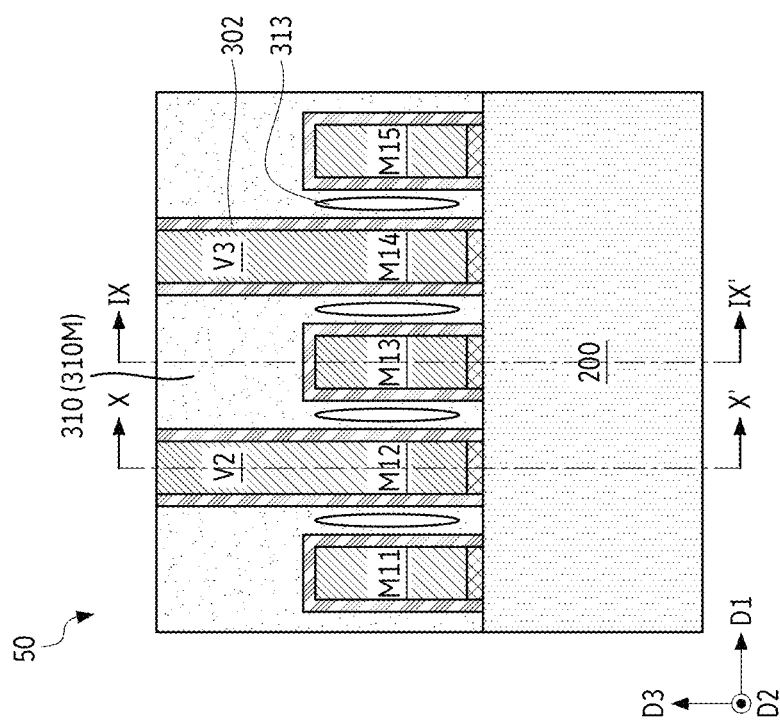
Figure 5F:
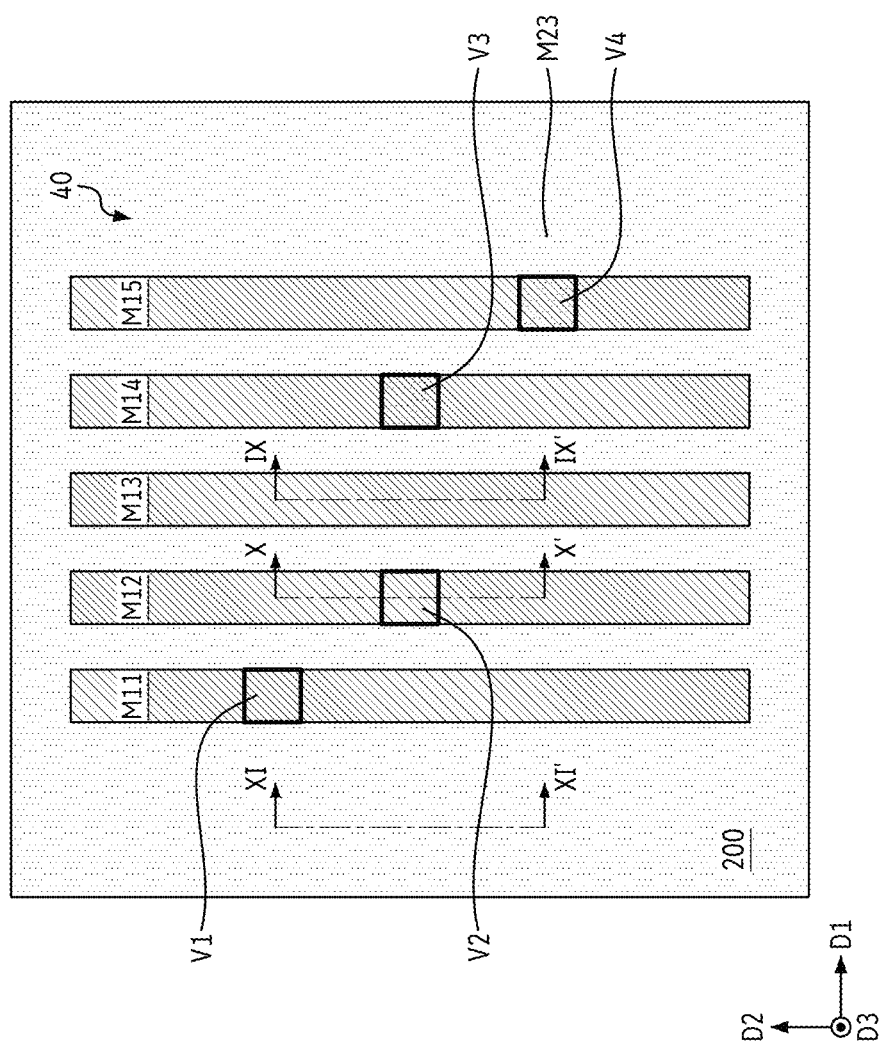
Figures 5G, 5H:
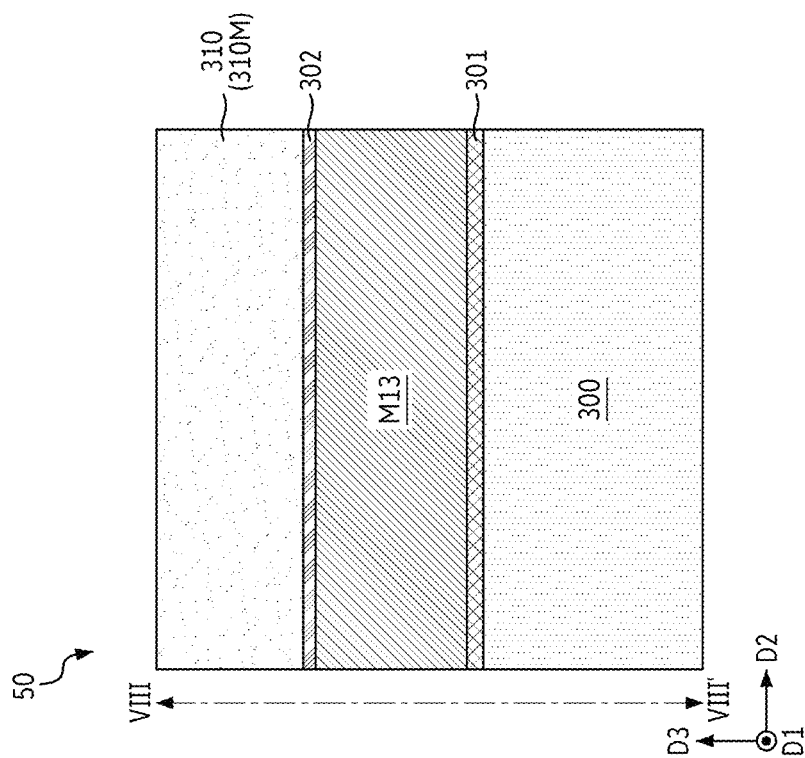
Figure 5I:
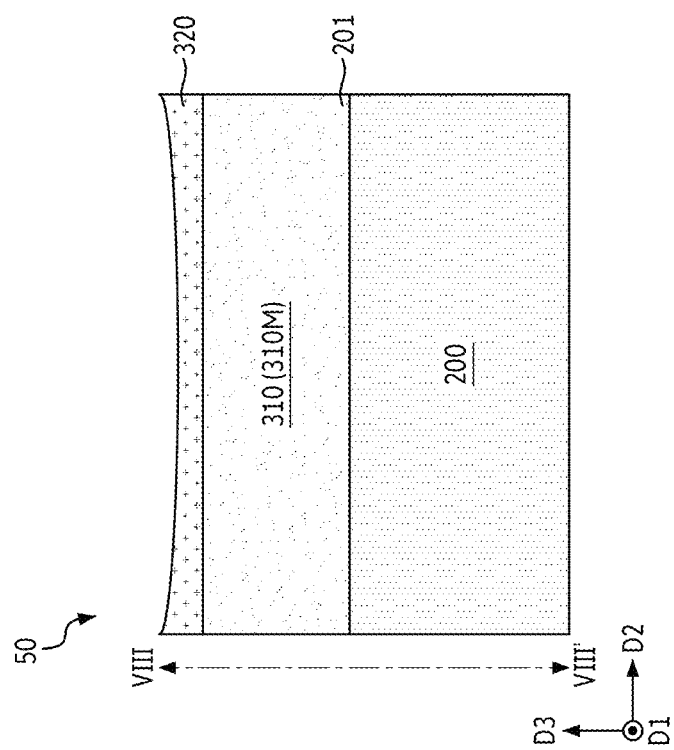

FIG. 5F is a plan view of FIG. 5E except the isolation layer 310 and the overburden layer 320 which may obscure the positions of the M1 metal lines M11-M15 and the top vias V1-V4 in the interconnect structure 50. The sidewall liner 302 is also omitted for brevity purposes. FIGS. 5G-5I are side cross-section views taken along lines IX-IX', X-X' and XI-XI', respectively, shown in FIGS. 5E and 5F FIGS. 5E-5I show that the interconnect structure 50 in its finished form obtained after the $2^{nd}$ planarization may include the overburden layer 320 in addition to the isolation layer 310.

Referring to FIGS. 5E, 5G and 5H, the M1 metal lines M11-M15 and the top vias V2 and V3 thereon may be surrounded by the isolation layer 310.

Referring to FIG. 5I, which is a side-cross section view of the line XI-XI' in a wide open area in the interconnect structure 50 where the M1 metal lines are not formed, the isolation layer 310 and the overburden layer 320 may both be formed on the base layer 300. This is because no M1 metal lines are formed in this area, and thus, the isolation layer 310 and the overburden layer 320 may be sequentially stacked. In this wide open area, the $2^{nd}$ portion 210M of the isolation layer 310 may remain without being planarized; however, the overburden layer 320 may have been planarized by the $1^{st}$ planarization at least to a minimal extent. Here, dishing may have occurred to the overburden layer 320 during the $1^{st}$ planarization similar to the IMD dishing as shown in FIG. 1C. Still, however, due to the $1^{st}$ and $2^{nd}$ planarization operations, a top edge or top surface of the overburden layer 320 may be formed to be lower than a level of the top surface TS2 of the top vias in the interconnect structure 50.

Figure 6A:
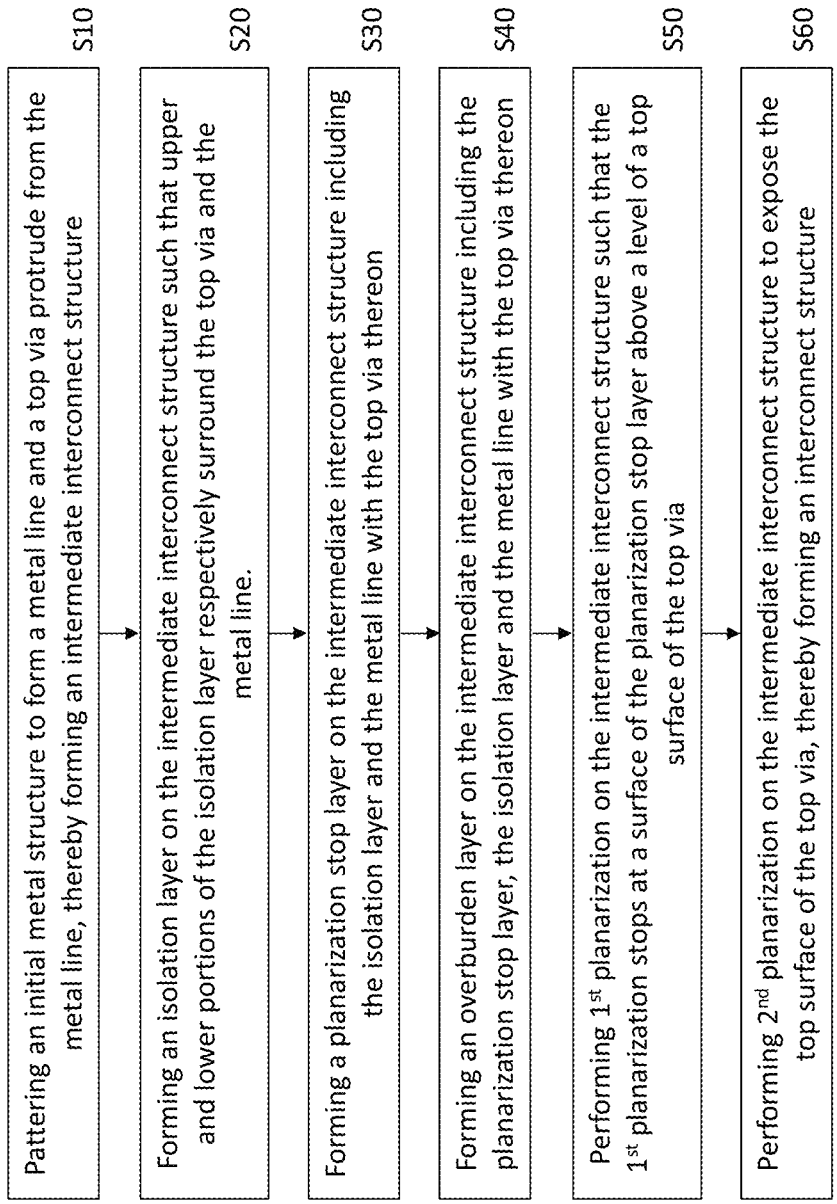
FIG. 6A illustrates a flowchart for a method of manufacturing a semiconductor device including an interconnect structure in which a planarization stop layer is formed in an isolation layer in reference to FIGS. 4A-4R, according to one or more embodiments.

FIG. 6A illustrates a flowchart for a method of manufacturing a semiconductor device including an interconnect structure in which a planarization stop layer is formed in an isolation layer in reference to FIGS. 4A-4R, according to one or more embodiments.

In step S10, an initial metal structure may be patterned to form a metal line and a top via thereon such that the top via takes a form of protrusion from the metal line without a connection surface, interface or a barrier layer therebetween, thereby to form an intermediate interconnect structure on a base layer (FIGS. 4A-4I). The formation of the top via may be performed by direct etching on an initial metal structure based on a hard mask pattern. The metal material forming the initial metal structure for the direct etching may be ruthenium (Ru).

In step S20, an isolation layer may be formed on the intermediate interconnect structure such that an upper portion of the isolation layer surrounds the top via, and the lower portion of the isolation layer surrounds the metal line (FIG. 4J) The isolation layer may be formed by depositing a $1^{st}$ dielectric material along an outer profile of the metal line with the top via thereon, and thus, a lower portion of the isolation layer may surround the metal line and an upper portion of the isolation layer may take a protrusion surrounding the top via.

In step S30, a planarization stop layer may be formed on the intermediate interconnect structure including the isolation layer and the metal line with the top via thereon such that a top surface of a lower portion of the planarization stop layer is at a level higher than a top surface of the top via while an upper portion of the planarization stop layer surrounds the upper portion of the isolation layer (FIG. 4K). The planarization stop layer may be formed by depositing a $2^{nd}$ dielectric material along an outer profile of the isolation layer. Thus, when the planarization stop layer is formed, the upper portion may surround the upper portion of the isolation layer and the top surface of the lower portion may be at the level higher than the top surface of the top via.

In step S40, an overburden layer may be formed on the intermediate interconnect structure including the planarization stop layer, the isolation layer and the metal line with the top via thereon (FIG. 4L). The overburden layer may be formed by depositing a $3^{rd}$ dielectric material on the planarization stop layer. The $1^{st}$ to $3^{rd}$ dielectric materials may be different from each other, or the $2^{nd}$ dielectric material may be different from the $1^{st}$ and $3^{rd}$ dielectric materials which may be the same.

In step S50, $1^{st}$ planarization may be performed on the intermediate interconnect structure including the overburden layer, the planarization stop layer, the isolation layer, and the metal line with the top via thereon such that the $1^{st}$ planarization stops at the top surface of the lower portion of the planarization stop layer (FIG. 4M).

In step S60, $2^{nd}$ planarization may be performed to expose the top surface of the top via to form an interconnect structure on the base layer, which may include the planarization stop layer remaining vertically on the isolation layer, which is vertically on the metal line, after the $1^{st}$ planarization and the $2^{nd}$ planarization (FIGS. 4N-4R).

Figure 6B:
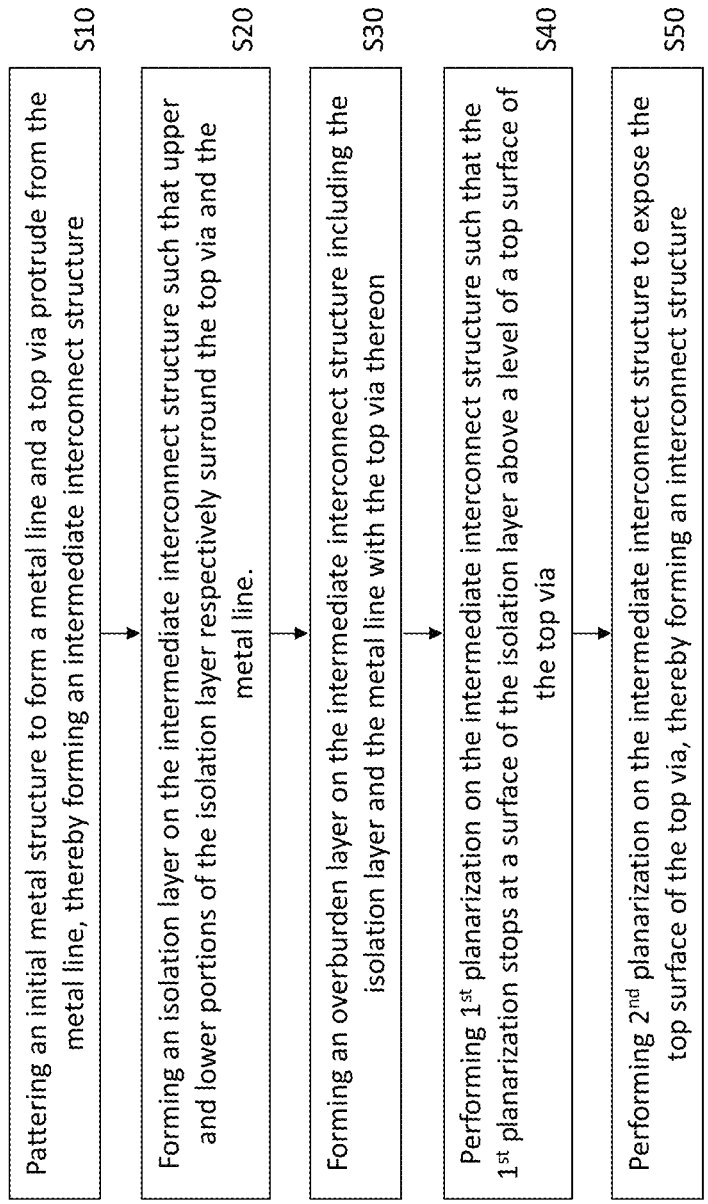
FIG. 6B illustrates a flowchart for a method of manufacturing a semiconductor device including an interconnect structure in which an isolation layer is used as a planarization stop layer in reference to FIGS. 5A-5I, according to one or more embodiments.

FIG. 6B illustrates a flowchart for a method of manufacturing a semiconductor device including an interconnect structure in which an isolation layer is used as a planarization stop layer in reference to FIGS. 5A-5I, according to one or more embodiments.

In step S10, a top via may be patterned on a metal line without a connection surface, interface or a barrier layer therebetween to form an intermediate interconnect structure on a base layer (FIG. 5A). The formation of the top via may be performed by direct etching on an initial metal structure based on a hard mask pattern. The metal material forming the initial metal structure for the direct etching may be ruthenium (Ru).

In step S20, an isolation layer may be formed on the intermediate interconnect structure such that an upper portion of the isolation layer surrounds the top via, the lower portion of the isolation layer surrounds the metal line, and a top surface of the lower portion is at a level higher than a top surface of the top via (FIG. 5B). The isolation layer may be formed by depositing the $1^{st}$ dielectric material along an outer profile of the metal line with the top via thereon, and thus, a lower portion of the isolation layer may surround the metal line and an upper portion of the isolation layer may take a protrusion surrounding the top via.

In step S30, an overburden layer may be formed on the interconnect structure including the isolation layer and the metal line with the top via thereon (FIG. 5C). The overburden layer may be formed by depositing the $3^{rd}$ dielectric material on the isolation layer. The $1^{st}$ and $2^{nd}$ dielectric materials may be different from each other.

In step S40, a $1^{st}$ planarization may be performed on the intermediate interconnect structure including the overburden layer, the isolation layer, and the metal line with the top via thereon such that the $1^{st}$ planarization stops at the top surface of the lower portion of the isolation layer (FIG. 5D).

In step S50, a $2^{nd}$ planarization may be performed to expose the top surface of the top via to form an interconnect structure on the base layer, which may include the isolation layer surrounding the metal line with the top via thereon (FIGS. 5E-5I).

FIG. 7 is a block diagram of a system-on-chip (SoC) 1000 including a semiconductor device in which at least one of the interconnect structure 40 shown in FIG. 4N and the interconnect structure 50 shown in FIG. 5E is formed, according to one or more embodiments.

Referring to FIG. 7, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data for use by the core 1011, the DSP 1012, and the GPU 1013. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include a semiconductor device in which at least one of the interconnect structures 40 and 50 shown in FIGS. 4N and 5E may be formed.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising a base layer and an interconnect structure on the base layer, the interconnect structure comprising:
    a $1^{st}$ metal line on the base layer;
    a $1^{st}$ top via vertically protruded from the $1^{st}$ metal line without a connection surface therebetween;
    an isolation layer on the $1^{st}$ metal line and the $1^{st}$ top via; and
    a planarization stop layer vertically and laterally on the isolation layer.

2. The semiconductor device of claim 1, wherein the isolation layer and the planarization stop layer comprise different materials.

3. The semiconductor device of claim 1, wherein the isolation layer laterally surrounds the $1^{st}$ top via, and
    wherein the isolation layer is vertically and laterally on the $1^{st}$ metal line.

4. The semiconductor device of claim 1, wherein top surfaces of the $1^{st}$ top via, the isolation layer and the planarization stop layer are substantially coplanar in a horizontal direction.

5. The semiconductor device of claim 1, wherein a height of the $1^{st}$ top via from a top surface of the $1^{st}$ metal line is substantially equal to a sum of vertical thicknesses of the isolation layer and the planarization stop layer vertically on the $1^{st}$ metal line.

6. The semiconductor device of claim 1, further comprising:
    a $2^{nd}$ metal line adjacent to the $1^{st}$ metal line with the isolation layer therebetween at a same level as the $1^{st}$ metal line; and
    an air gap between the $1^{st}$ metal line and the $2^{nd}$ metal line.

7. The semiconductor device of claim 1, wherein the $1^{st}$ metal line comprises ruthenium (Ru).

8. The semiconductor device of claim 1, further comprising:
    a $2^{nd}$ metal line at a same level as the $1^{st}$ metal line,
    wherein the isolation layer and the planarization stop layer are sequentially on the $2^{nd}$ metal line in a vertical direction.

9. A semiconductor device comprising a base layer and an interconnect structure on the base layer, the interconnect structure comprising:
    a metal line on the base layer;
    a top via vertically protruded from the metal line without a connection surface therebetween;
    an isolation layer vertically on the metal line and laterally on the top via; and
    an open area on the base layer where no metal line is formed at a level where the metal line is provided,
    wherein the open area comprises at least two dielectric layers comprising the isolation layer which is vertically on the base layer.

10. The semiconductor device of claim 9, wherein the at least two dielectric layers in the open area comprises an overburden layer vertically on the isolation layer,
    wherein the overburden layer and the isolation layer comprise different materials, and
    wherein the overburden layer is not provided vertically on the metal line.

11. The semiconductor device of claim 10, wherein a top surface of the overburden layer in the open area is at a level below a top surface of the top via and concave toward the isolation layer.

12. The semiconductor device of claim 9, further comprising:
    a planarization stop layer vertically and laterally on the isolation layer;
    wherein the at least two dielectric layers further comprises the planarization stop layer and an overburden layer vertically on the planarization stop layer,
    wherein the planarization stop layer comprises a $2^{nd}$ material different from a $1^{st}$ material included in the isolation layer, and the overburden layer comprises a $3^{rd}$ material different from the $2^{nd}$ material, and
    wherein the overburden layer is not provided vertically on the metal line.

13. The semiconductor device of claim 12, wherein a height of the top via from a top surface of the metal line is substantially equal to a sum of vertical thicknesses of the isolation layer vertically on the metal line and the planarization stop layer vertically on the isolation layer vertically on the metal line.

14. The semiconductor device of claim 12, wherein a vertical thickness of the isolation layer vertically on the metal line is the same as a vertical thickness of the isolation layer in the open area.

15. The semiconductor device of claim 12, wherein a top surface of the overburden layer is below a level of a top surface of the top via and concave toward the planarization stop layer.

16. The semiconductor device of claim 12, wherein the planarization stop layer comprises silicon nitride.

17. The semiconductor device of claim 9, wherein the top via comprises ruthenium (Ru).

18. A method of manufacturing a semiconductor device, the method comprising:
- patterning an initial metal structure to form a metal line and a top via thereon such that the top via is protruded from the metal line;
- forming at least two dielectric layers which are vertically stacked on the metal line with the top via thereon;
- performing $1^{st}$ planarization such that the $1^{st}$ planarization stops at a level above a top surface of the top via; and
- performing $2^{nd}$ planarization such that the top surface of the top via is exposed.

19. The method of claim 18, wherein the at least two dielectric layers comprise:
- an isolation layer comprising a $1^{st}$ dielectric material; and
- an overburden layer comprising a $2^{nd}$ dielectric material different from the $1^{st}$ dielectric material,
- wherein the $1^{st}$ planarization is controlled to stop at a surface of the isolation layer which is at the level above the top surface of the top via.

20. The method of claim 19, wherein the at least two dielectric layers comprise:
- an isolation layer comprising a $1^{st}$ dielectric material;
- a planarization stop layer comprising a $2^{nd}$ dielectric material; and
- an overburden layer comprising a $3^{rd}$ dielectric material different from the $2^{nd}$ dielectric material,
- wherein the $1^{st}$ planarization is controlled to stop at a surface of the planarization stop layer which is at the level above the top surface of the top via.

* * * * *